(12) United States Patent
Machida

(10) Patent No.: US 11,402,158 B2
(45) Date of Patent: Aug. 2, 2022

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 54 days.

(21) Appl. No.: 16/533,236

(22) Filed: Aug. 6, 2019

(65) Prior Publication Data

US 2020/0049419 A1  Feb. 13, 2020

(30) Foreign Application Priority Data

Aug. 13, 2018 (JP) .............................. JP2018-152493

(51) Int. Cl.
  *F28D 15/04* (2006.01)
  *F28F 3/08* (2006.01)
  *G06F 1/20* (2006.01)
  *H01L 23/427* (2006.01)

(52) U.S. Cl.
  CPC ............... *F28D 15/04* (2013.01); *F28F 3/08* (2013.01); *B01D 2259/657* (2013.01); *G06F 1/206* (2013.01); *H01L 23/427* (2013.01)

(58) Field of Classification Search
  CPC .... F28D 15/04; F28D 15/043; F28D 15/0283; F28F 3/08; B01D 2259/657; G06F 1/206; H01L 23/427
  See application file for complete search history.

(56) References Cited

U.S. PATENT DOCUMENTS

| 6,843,308 | B1* | 1/2005 | Duval ................. F28D 15/0233 165/104.26 |
| 11,009,927 | B2* | 5/2021 | Shioga ................ F28D 15/0266 |
| 11,044,830 | B2* | 6/2021 | Shioga ............... H05K 7/20327 |

(Continued)

FOREIGN PATENT DOCUMENTS

| JP | 2015-183880 A | 10/2015 |
| JP | 6146484 | 5/2017 |

(Continued)

OTHER PUBLICATIONS

European Search Report dated Jan. 21, 2020, 5 pages.
Japanese Office Action dated May 24, 2022, English abstract included, 10 pages.

*Primary Examiner* — Gordon A Jones
(74) *Attorney, Agent, or Firm* — Rankin, Hill & Clark LLP

(57) ABSTRACT

A loop heat pipe includes: an evaporator configured to evaporate working fluid; a condenser configured to condense the working fluid; a liquid pipe which connects the evaporator and the condenser; a vapor pipe which connects the evaporator and the condenser and forms a loop together with the liquid pipe; and a porous body which is provided in the liquid pipe and configured to reserve liquid-phase working fluid. The liquid pipe includes an injection inlet through which the working fluid is injected. A first end of the porous body is located between the injection inlet and the evaporator. A second end of the porous body which is opposite to the first end is located between the injection inlet and the condenser. At least a portion of the porous body which is provided between the injection inlet and the evaporator fills the inside of the liquid pipe.

9 Claims, 15 Drawing Sheets

(56) References Cited

U.S. PATENT DOCUMENTS

| | | | |
|---|---|---|---|
| 2003/0205363 A1 | 11/2003 | Chu et al. | |
| 2007/0102138 A1 | 5/2007 | Kadota et al. | |
| 2010/0044014 A1* | 2/2010 | Ho | F28D 1/035 165/104.26 |
| 2011/0214840 A1 | 9/2011 | Sakamoto et al. | |
| 2016/0259383 A1* | 9/2016 | Shioga | G06F 1/203 |
| 2018/0058767 A1 | 3/2018 | Mchida et al. | |
| 2018/0087844 A1 | 3/2018 | Huang | |

FOREIGN PATENT DOCUMENTS

| | | |
|---|---|---|
| JP | 2018-036012 | 3/2018 |
| JP | 2002-039693 | 2/2022 |

\* cited by examiner

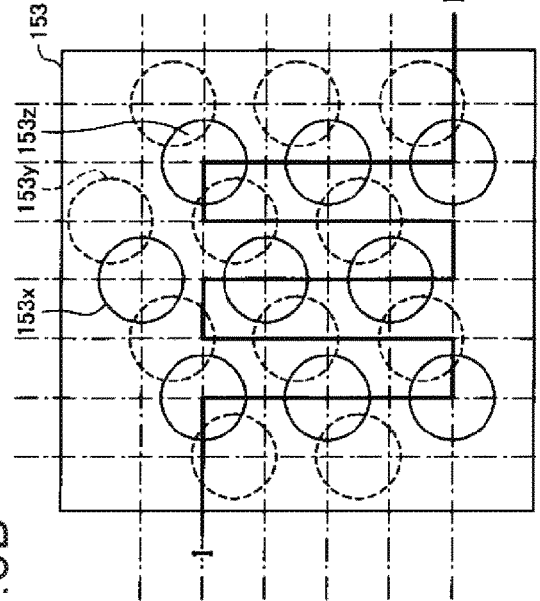
FIG.6A
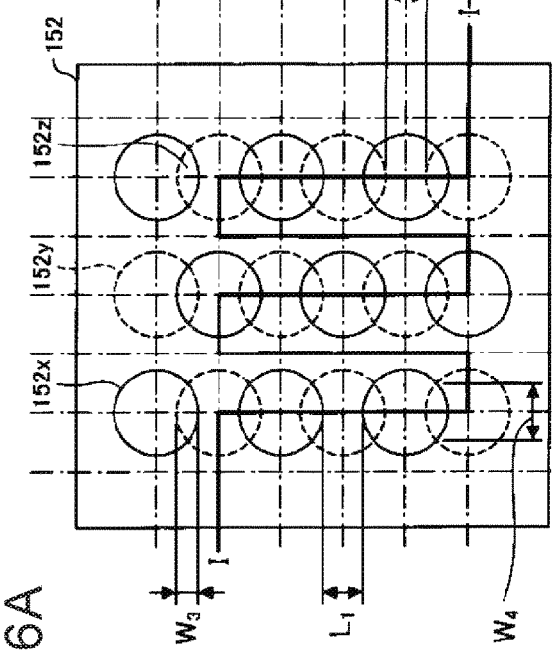
FIG.6C
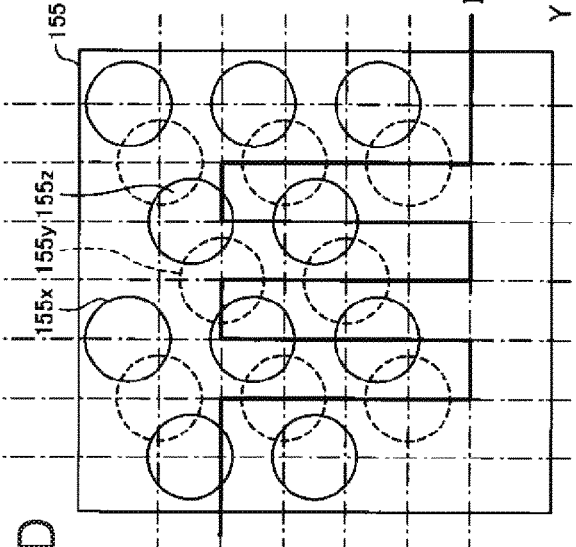
FIG.6B
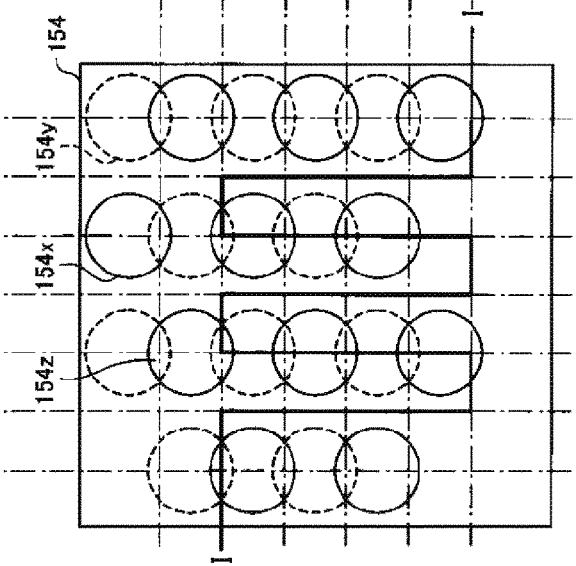
FIG.6D
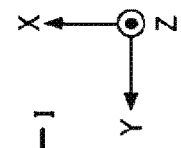

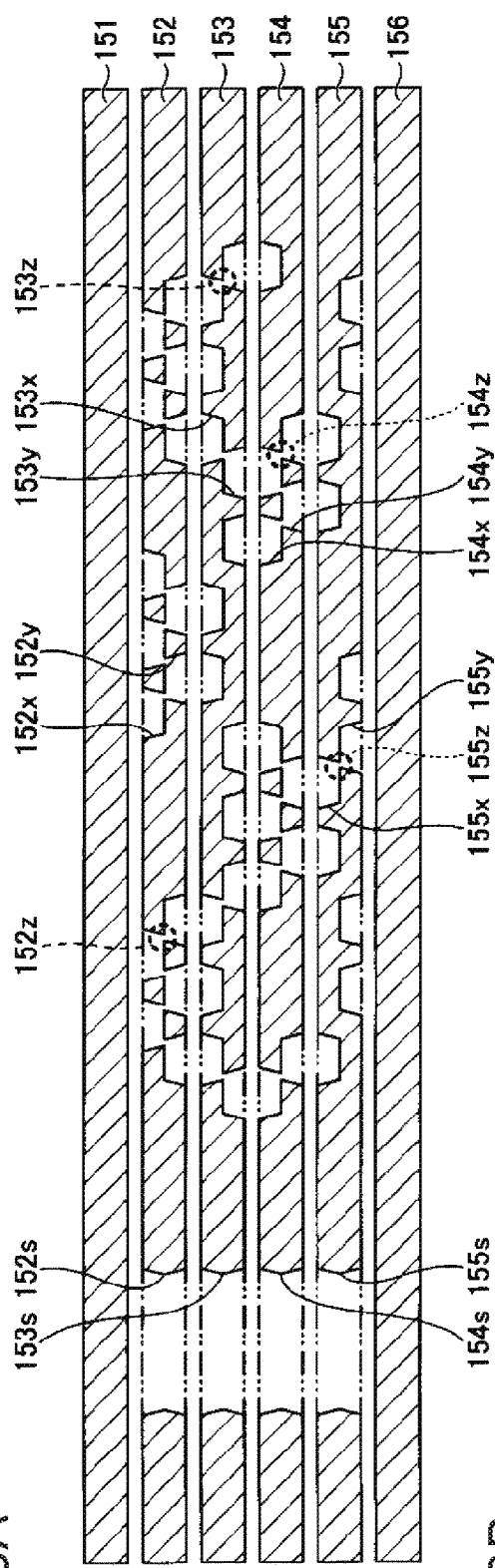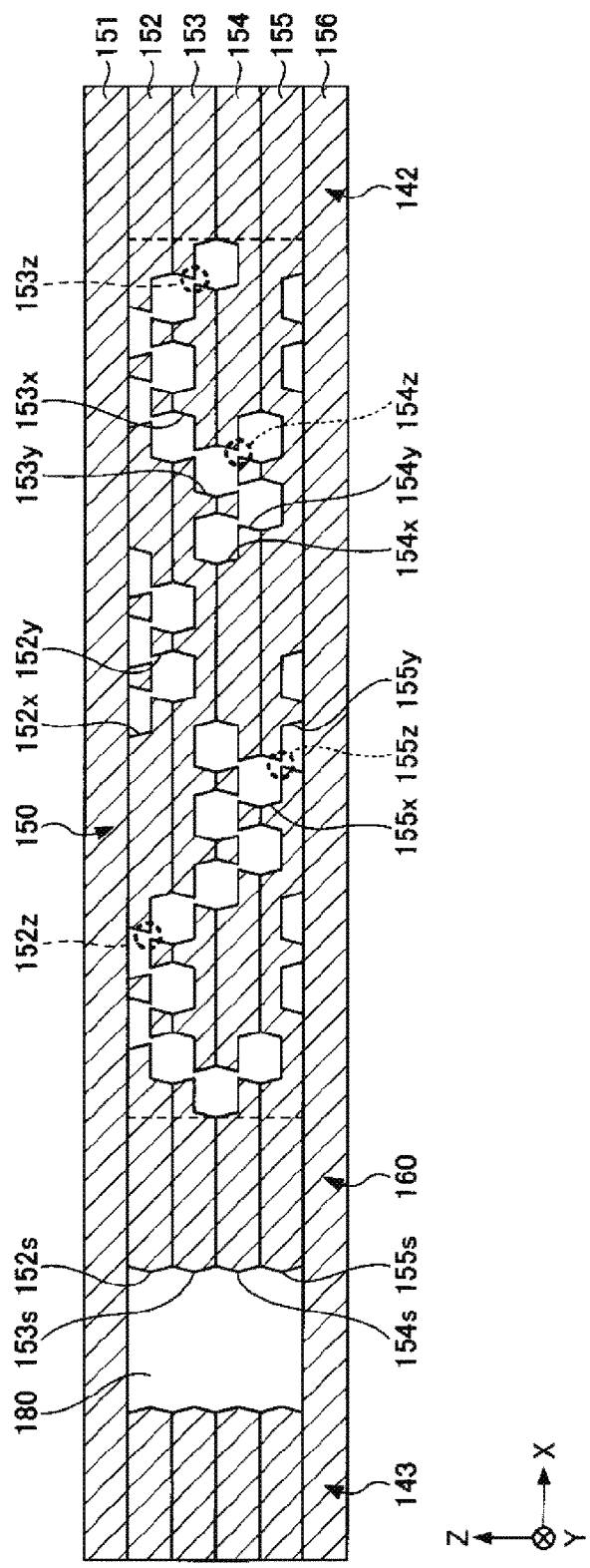

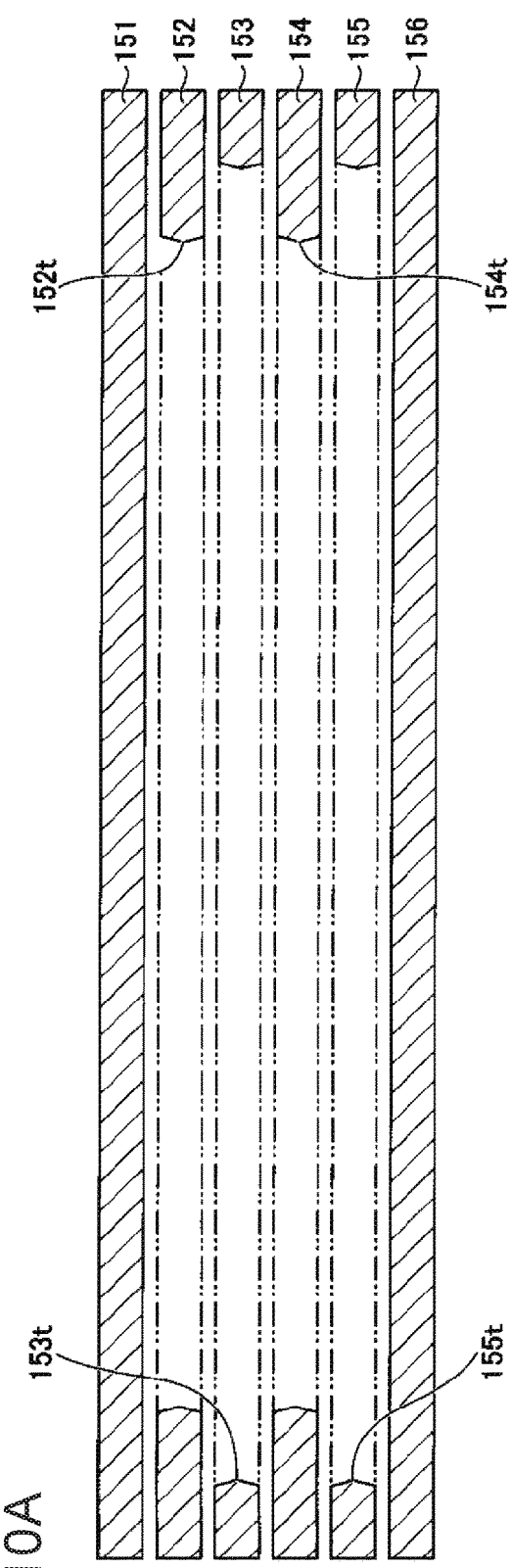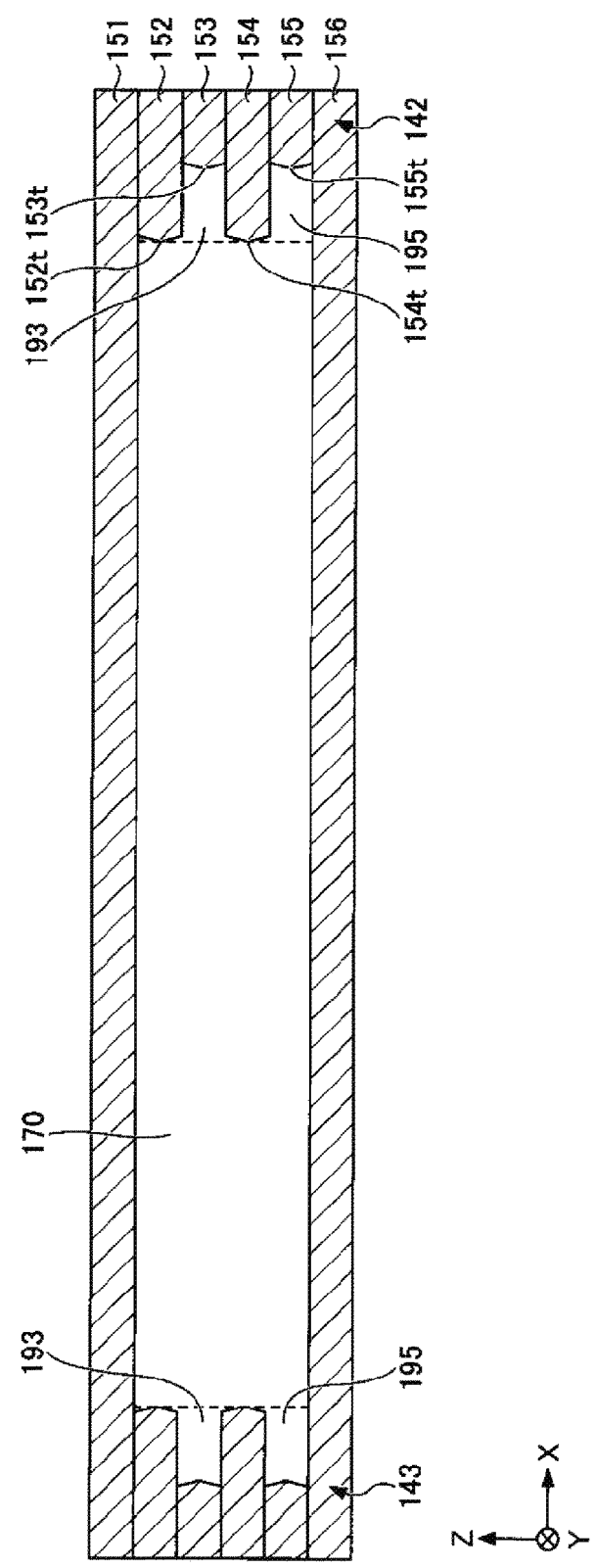

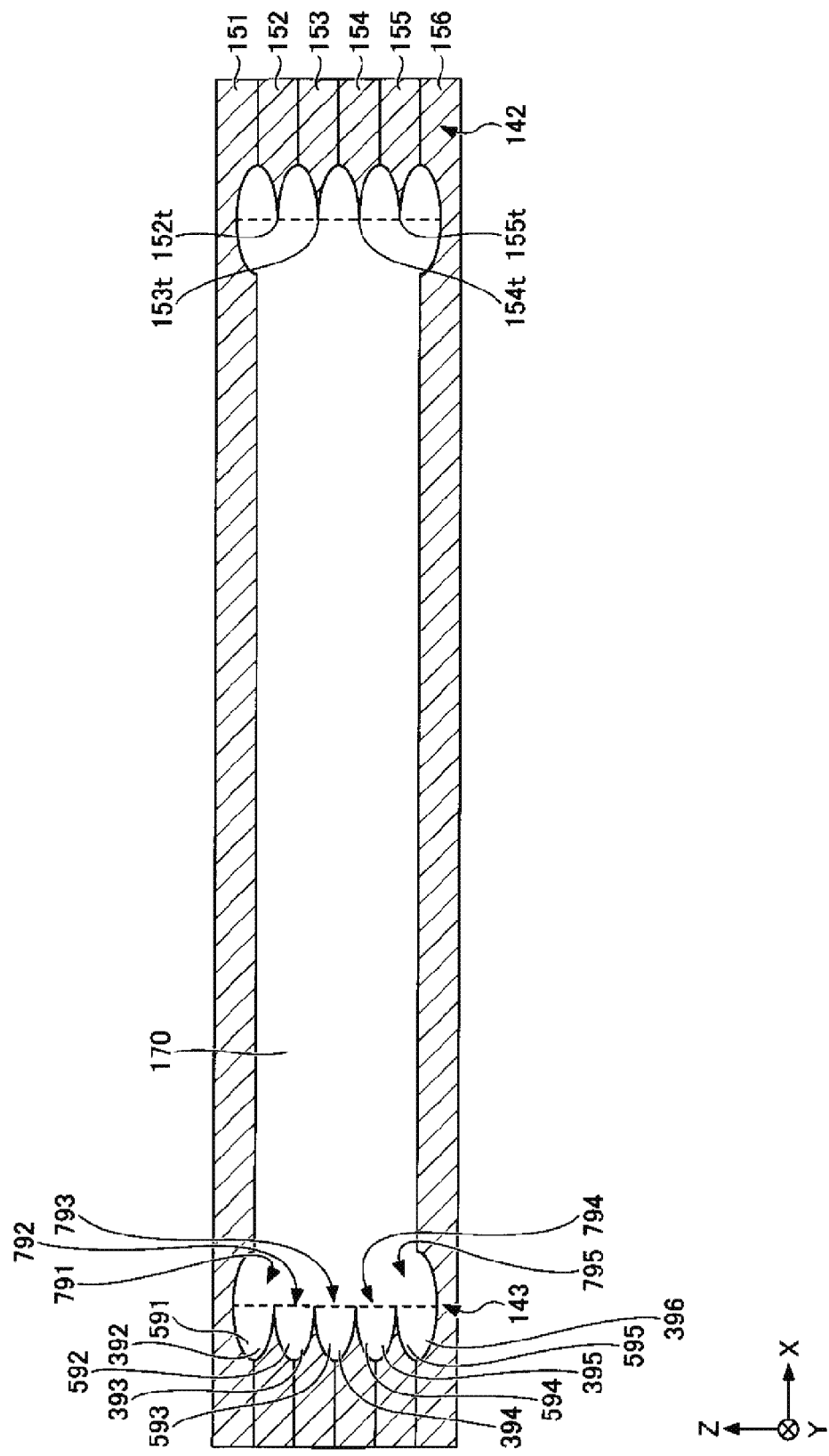

LOOP HEAT PIPE

This application claims priority from Japanese Patent Applications No. 2018-152493, filed on Aug. 13, 2018, the entire contents of which are herein incorporated by reference.

BACKGROUND

1. Technical Field

The present disclosure relates to a loop heat pipe.

2. Background Art

Heat pipes are known as devices for cooling a heat generation component such as a CPU (central processing unit) that is installed in an electronic device. The heat pipe is a device that transports heat utilizing phase transition of a working fluid.

An example heat pipe is a loop heat pipe that is equipped with an evaporator that evaporates working fluid by heat generated by a heat generation component and a condenser that liquefies evaporated working fluid by cooling it, and in which the evaporator and the condenser are connected to each other by a liquid pipe and a vapor pipe that form a loop-shaped flow channel. In loop heat pipes, the working fluid flows through a loop-shaped flow channel in one direction.

A porous body is provided in a liquid pipe of a loop heat pipe, and working fluid in the liquid pipe is guided to the evaporator by capillary forces generated in the porous body, whereby a reverse flow of vapor from the evaporator to the liquid pipe is suppressed. A number of pores are formed in the porous body. Pores are formed by laying, one on another, metal layers through each of which through-holes are formed in such a manner that adjacent through-holes overlap with each other. Refer to Japanese Patent No. 6,146,484, for example.

However, the loop heat pipe disclosed in Japanese Patent No. 6,146,484 has a problem that drying-out occurs due to shortage of working fluid in the liquid pipe during use of the loop heat pipe.

SUMMARY

Certain embodiments provide a loop heat pipe.
The loop heat pipe comprises:
an evaporator configured to evaporate working fluid;
a condenser configured to condense the working fluid,
a liquid pipe which connects the evaporator and the condenser;
a vapor pipe which connects the evaporator and the condenser and forms a loop together with the liquid pipe; and
a porous body which is provided in the liquid pipe and configured to reserve liquid-phase working fluid.
The liquid pipe comprises an injection inlet through which the working fluid is injected.
A first end of the porous body is located between the injection inlet and the evaporator.
A second end of the porous body which is opposite to the first end is located between the injection inlet and the condenser.
At least a portion of the porous body which is provided between the injection inlet and the evaporator fills the inside of the liquid pipe.

BRIEF DESCRIPTION OF DRAWINGS

FIGS. 6A-6D are plan views showing example arrangements of bottomed holes of a porous body in second, third, fourth, and fifth metal layers, respectively;

FIGS. 8A and 8B are a second set of sectional views showing the example manufacturing method of a loop heat pipe according to the first embodiment;

FIGS. 10A and 10B are a fourth set of sectional views showing the example manufacturing method of a loop heat pipe according to the first embodiment;

FIG. 15 is a second sectional view showing an example internal structure of the loop heat pipe according to the third embodiment.

DESCRIPTION OF EMBODIMENTS

Embodiments will be hereinafter described in a specific manner with reference to the accompanying drawings. In this specification, constituent elements having substantially the same function and structure will be given the same reference symbol and a redundant description therefor may be omitted.

Embodiment 1

Figure 1:
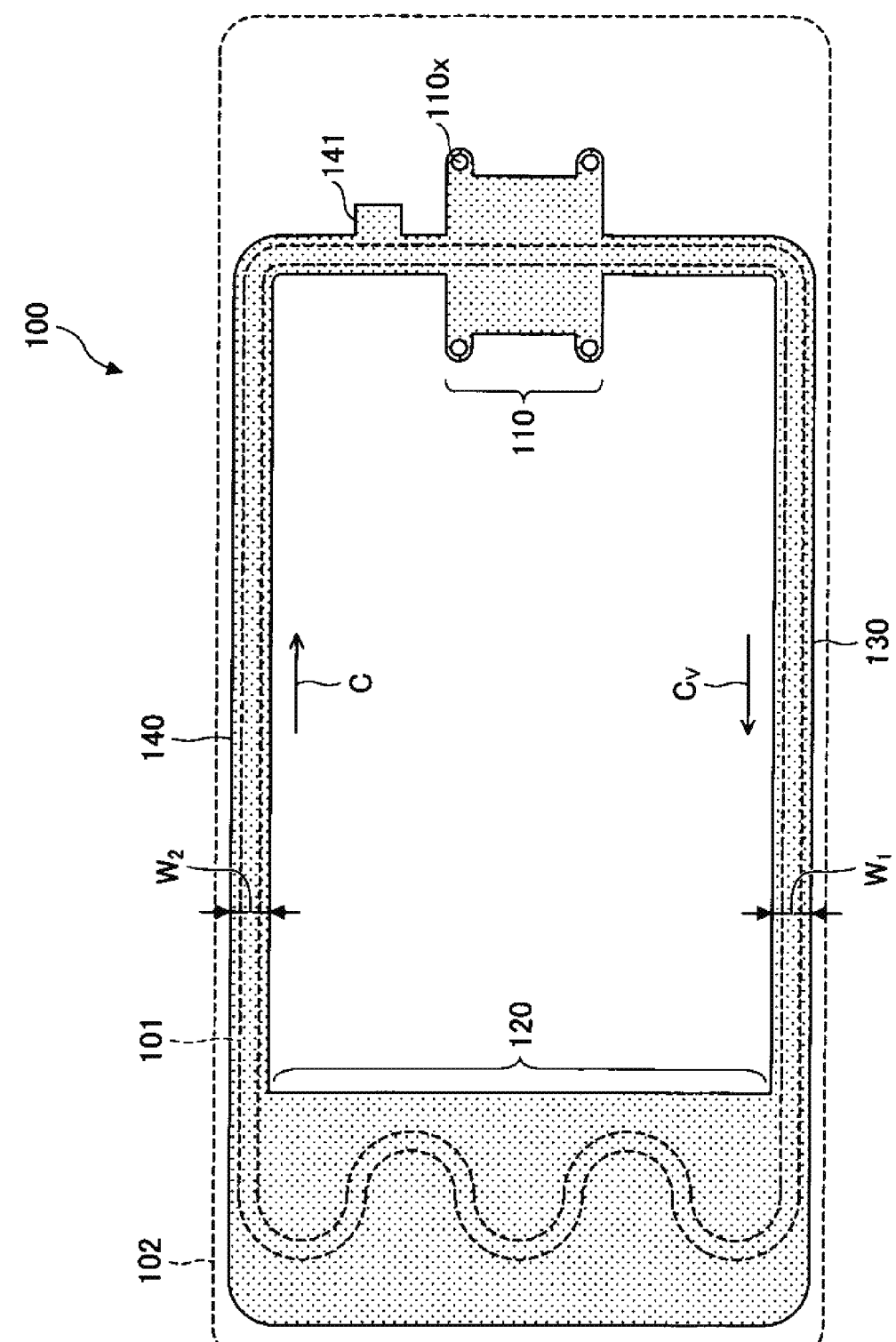
FIG. 1 is a schematic plan view showing a loop heat pipe according to a first embodiment.

A first embodiment will be described below which relates to a loop heat pipe.
[Configuration of Loop Heat Pipe 100]
FIG. 1 is a schematic plan view showing a loop heat pipe 100 according to the first embodiment.
As shown in FIG. 1, the loop heat pipe 100 according to the first embodiment is equipped with an evaporator 110, a condenser 120, a vapor pipe 130, and a liquid pipe 140. The loop heat pipe 100 can be housed in a mobile electronic device 102 such as a smartphone or a tablet terminal.

In the loop heat pipe 100, the evaporator 10 is configured to generate vapor Cv by evaporating working fluid C. The condenser 120 is configured to condense vapor Cv into working fluid C. The evaporator 110 and the condenser 120 are connected to each other by the vapor pipe 130 and the liquid pipe 140, and the vapor pipe 130 and the liquid pipe 140 form a flow channel 101 that is a loop through which the working fluid C or the vapor Cv flows.

The liquid pipe 140 is formed with an injection inlet 141 through which working fluid C is injected. The injection inlet 141 is closed after injection of working fluid C.

Figure 2:
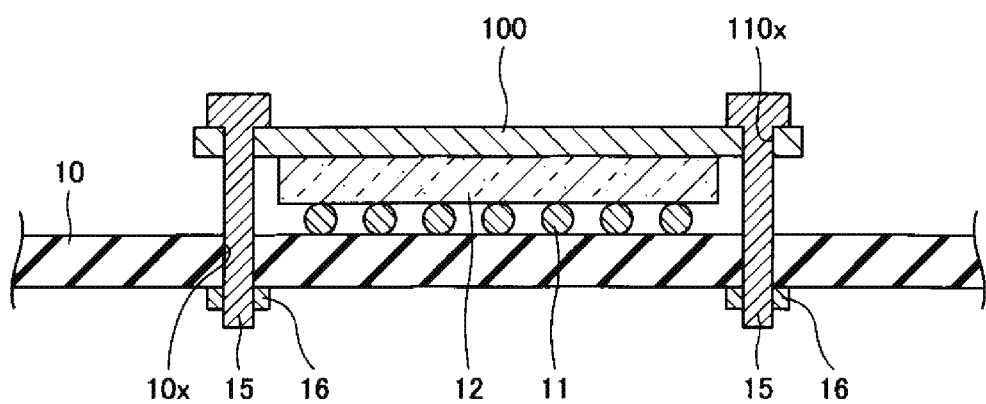
FIG. 2 is a sectional view showing an evaporator and its neighborhood of the loop heat pipe according to the first embodiment.

FIG. 2 is a sectional view showing the evaporator 110 and its neighborhood of the loop heat pipe 100 according to the first embodiment. As shown in FIGS. 1 and 2, the evaporator 110 is formed with four through-holes 110x, for example. The evaporator 110 is fixed to a circuit board 10 by inserting bolts 15 through the respective through-holes 110x and engaging nuts 16 with them from the side of the bottom surface of the circuit board 10.

A heat generation component 12 such as a CPU is mounted on the circuit board 10 via bumps 11, and the top surface of the heat generation component 12 is in close contact with the bottom surface of the evaporator 110. The working fluid C in the evaporator 110 is evaporated by heat generated by the heat generation component 12 and vapor Cv is thereby generated.

As shown in FIG. 1, the vapor Cv generated by the evaporator 110 is guided to the condenser 120 through the vapor pipe 130 and liquefied in the condenser 120. As a result, heat that was generated by the heat generation component 12 is moved to the condenser 120, whereby temperature increase of the heat generation component 12 is suppressed. Working fluid C produced by the condenser 120 through liquefaction passes through the liquid pipe 140 and is thereby guided to the evaporator 110. For example, the widths $W_1$ and $W_2$ of the vapor pipe 130 and the liquid pipe 140 may be set at about 8 mm and 6 mm, respectively. However, the widths $W_1$ and $W_2$ of the vapor pipe 130 and the liquid pipe 140 are not limited to these values and may be identical, for example.

There are no particular limitations on the kind of the working fluid C. To cool the heat generation component 12 efficiently using heat of evaporation, it is preferable to use a fluid having a high saturated vapor pressure and a large heat of evaporation. Examples of such a fluid are ammonia, water, chlorofluorocarbon, alcohol, and acetone.

Figure 4:
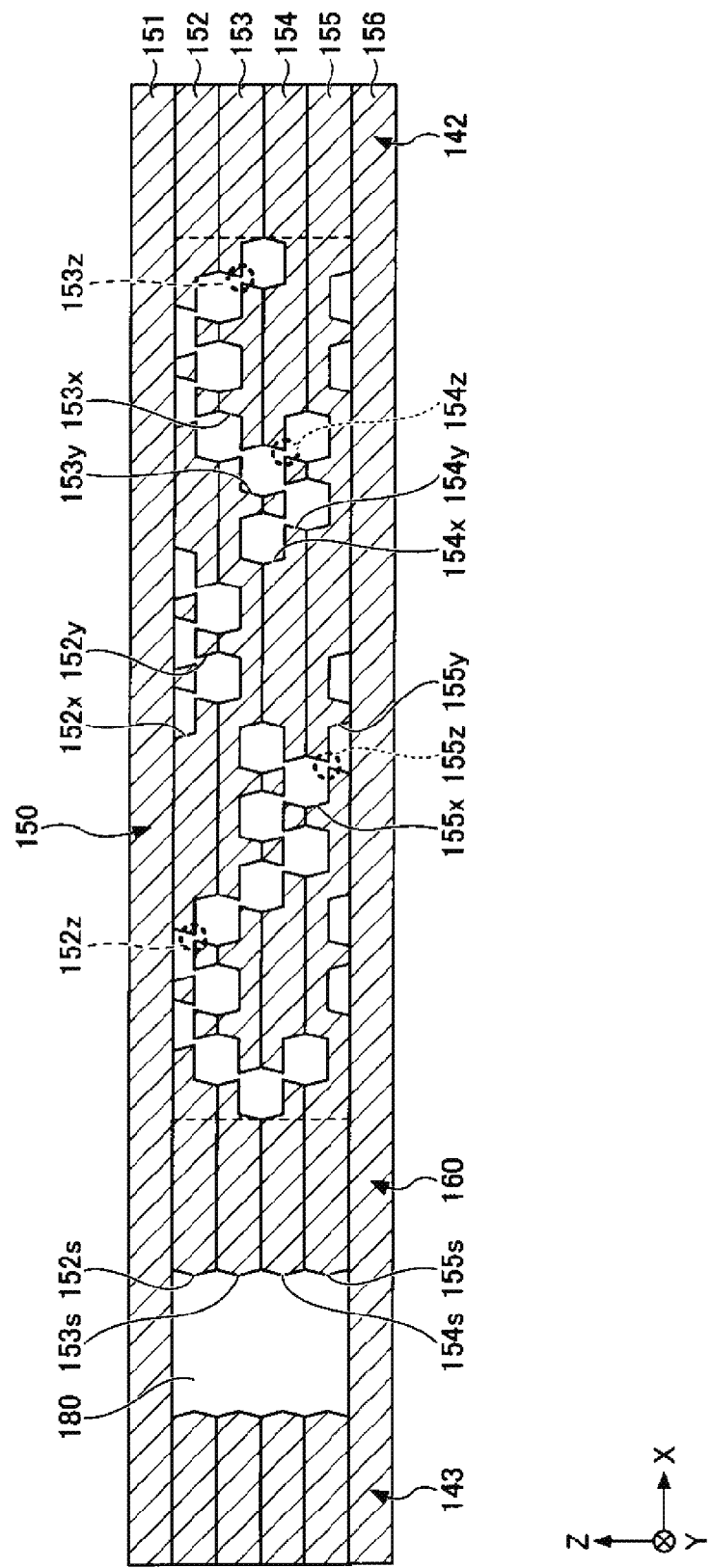
FIG. 4 is a first sectional view showing an example internal structure of the loop heat pipe according to the first embodiment.
Figure 5:
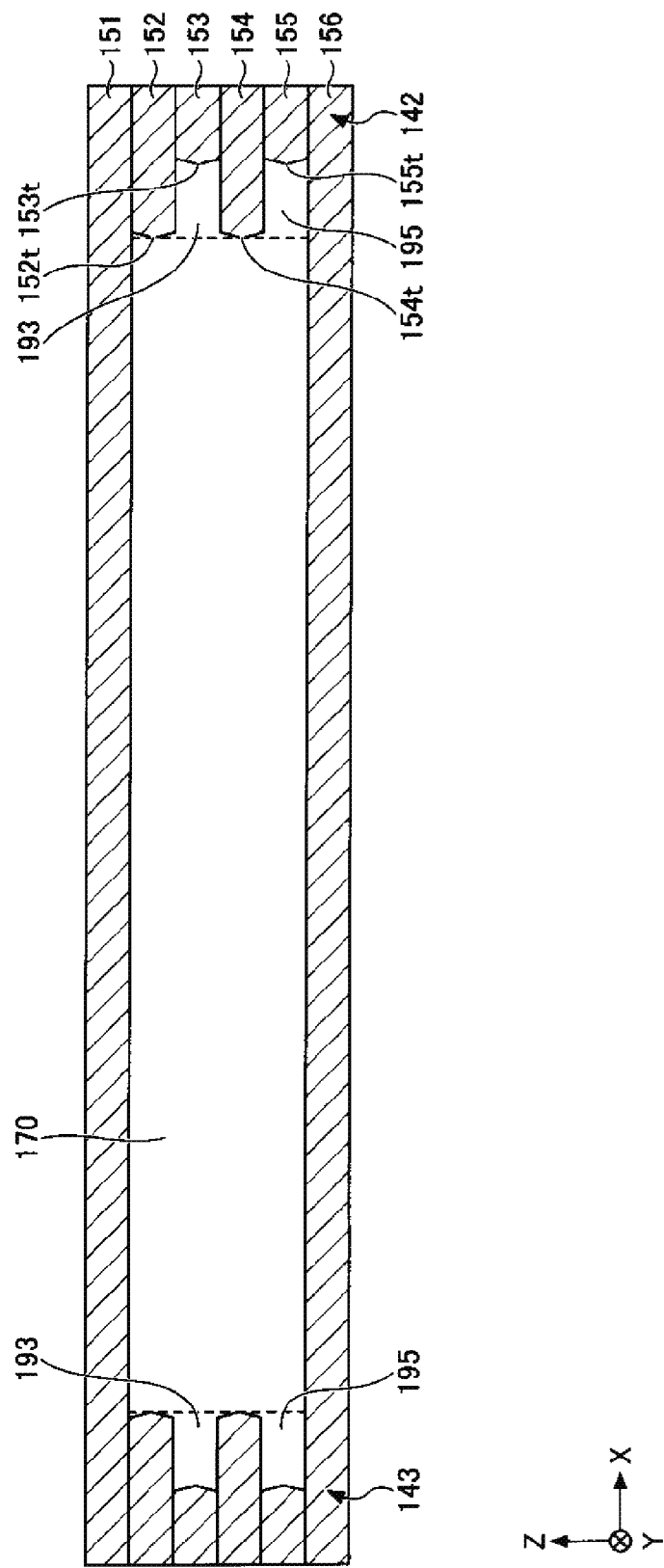
FIG. 5 is a second sectional view showing the example internal structure of the loop heat pipe according to the first embodiment.

As shown in FIGS. 4 and 5, each of the evaporator 110, the condenser 120, the vapor pipe 130, and the liquid pipe 140 may have, for example, a structure in which plural metal layers are stacked one on another. The metal layers are, for example, copper layers which are superior in thermal conductivity and are joined to each other directly by solid-phase joining or the like. The thickness of each metal layer may be about 50 to 200 μm, for example.

The meal layers are not limited to copper layers and may be stainless steel layers, aluminum layers, magnesium alloy layers, or the like. There are no particular limitations on the number of metal layers stacked one on another.

Figure 3:
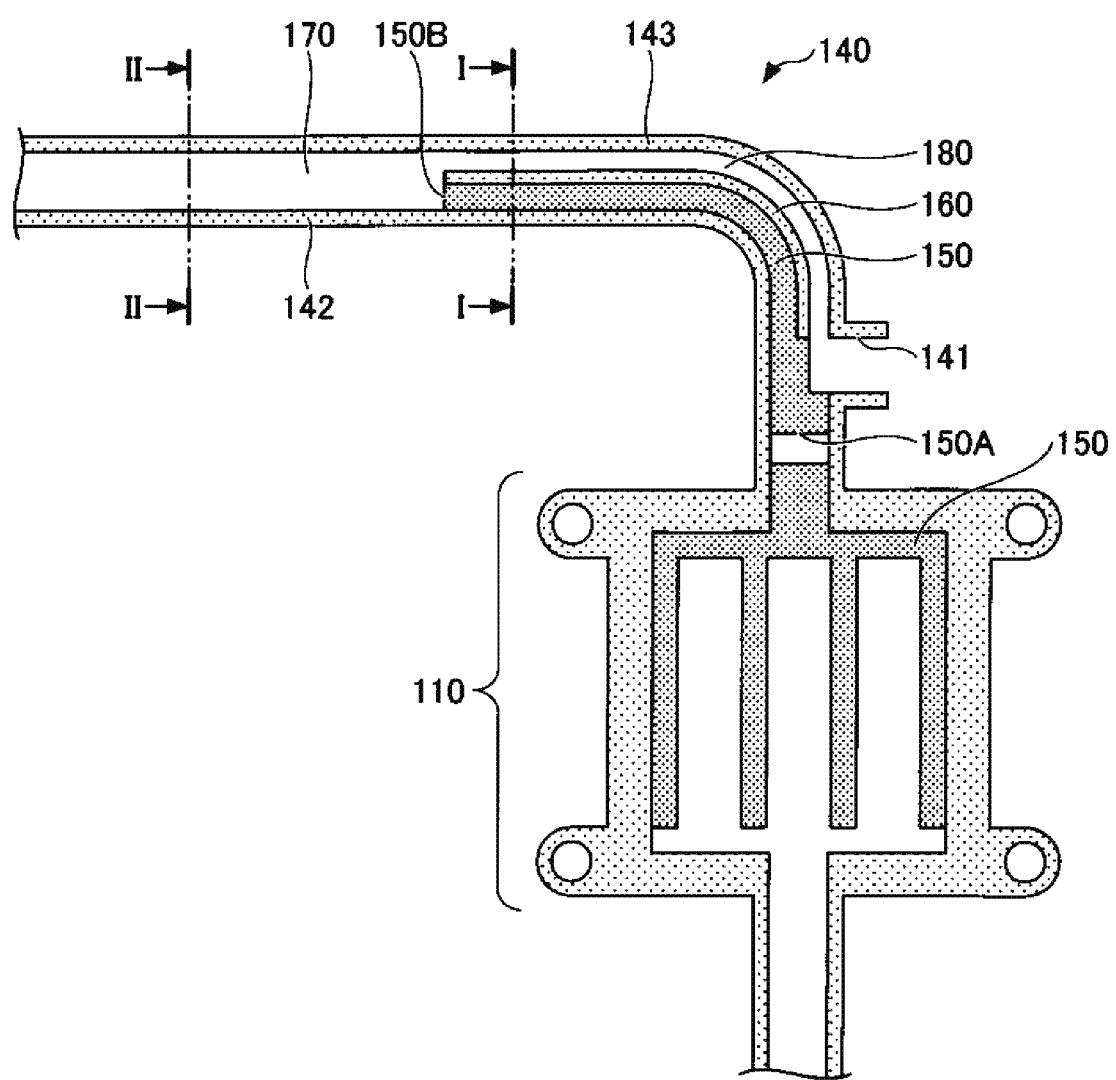
FIG. 3 is a partial schematic plan view showing an example internal structure of an injection inlet and its neighborhood of a liquid pipe of the loop heat pipe according to the first embodiment.

FIG. 3 is a partial schematic plan view showing an example internal structure of the injection inlet 141 and its neighborhood of the liquid pipe 140 of the loop heat pipe 100 according to the first embodiment. FIG. 3 is drawn in such a manner that one outermost metal layer (a metal layer 151 shown in FIGS. 4 and 5) is omitted.

As shown in FIG. 3, in the vicinity of the injection inlet 141, a porous body 150 is formed so as to be in contact with an inside pipe surface 142 of the liquid pipe 140. For example, the porous body 150 is integrally formed with the liquid pipe 140. The porous body 150 is configured to reserve liquid-phase working fluid C. In the direction parallel with the liquid pipe 140, one end 150A of the porous body 150 is located between the injection inlet 141 and the evaporator 110 and the other end 150B of the porous body 150 is located between the injection inlet 141 and the condenser 120.

On the condenser 120 side of the injection inlet 141, the porous body 150 is spaced from an outside pipe wall 143 of the liquid pipe 140 and a connection flow channel 180 is formed between the porous body 150 and the pipe wall 143. The connection flow channel 180 communicates with the injection inlet 141. A solid support member 160 is formed between the porous body 150 and the connection flow channel 180 so as to separate the porous body 150 and the connection flow channel 180 from each other. As such, the support member 160 functions as a separation member for separating the porous body 150 and the connection flow channel 180 from each other. The support member 160 is formed between the porous body 150 and the connection flow channel 180 so as to extend between the injection inlet 141 and the end 150B of the porous body 150.

A flow channel 170 which is a space enclosed by the pipe walls 142 and 143, one outermost metal layer (metal layer 151 shown in FIGS. 4 and 5), and the other outermost metal layer (metal layer 156 shown in FIGS. 4 and 5) exists between the end 150B of the porous body 150 and condenser 120 in the liquid pipe 140. The flow channel 170 is part of the flow channel 101. The connection flow channel 180 communicates with the flow channel 170, and liquid-phase working fluid C that has been injected through the injection inlet 141 flows into the flow channel 170 via the connection flow channel 180.

On the evaporator 110 side of the injection inlet 141, the porous body 150 is in contact with not only the inside pipe surface 142 but also the outside pipe wall 143. The porous body 150 fills at least part of the inside space of the liquid pipe 140 between the injection inlet 141 and the evaporator 110.

The liquid pipe 140, the porous body 150, the support member 160, the flow channel 170, and the connection flow channel 180 will be described below in detail. FIGS. 4 and 5 are sectional views showing an example internal structure of the loop heat pipe 100 according to the first embodiment. FIGS. 4 and 5 are sectional views taken along lines I-I and II-II in FIG. 3, respectively. FIGS. 6A-6D are plan views showing example arrangements of bottomed holes in second to fifth metal layers 152-155, respectively. Cross sections taken along lines I-I in FIGS. 6A-6D correspond to the cross section of the porous body 150 shown in FIG. 4. In the porous body 150, in actuality, the straight line I-I shown in FIG. 3 is like the lines I-I shown in FIG. 6A-6D.

For example, the liquid pipe 140, the porous body 150, and the support member 160 may have a structure that six metal layers 151-156 are laid one on another. The metal layers 151-156 are, for example, copper layers which are superior in thermal conductivity and are joined to each other directly by solid-phase joining or the like. The thickness of each of the metal layers 151-156 may be about 50 to 200 μm, for example. The metal layers 151-156 are not limited to metal layers and may be stainless steel layers, aluminum layers, magnesium alloy layers, or the like. There are no particular limitations on the number of metal layers laid one on another; five or less metal layers or seven or more metal layers may be laid one on another.

In FIGS. 4, 5, and 6A-6D, the Z direction is defined as the lamination direction of the metal layers 151-156, the Y direction is defined as the direction extending along the liquid pipe 140 in a plane perpendicular to the Z direction, and the X direction is defined as the direction perpendicular to the Y direction in this plane (these definitions also apply to following similar drawings.).

In the liquid pipe 140, the porous body 150, and the support member 160, no holes or grooves are formed in the first metal layer 151 (one outermost metal layer) or the sixth metal layer 156 (the other outermost metal layer). On the other hand, as shown in FIGS. 4 and 6A, plural bottomed holes 152x which are recessed from the top surface to approximately the center in the thickness direction and plural bottomed holes 152y which are recessed from the bottom surface to approximately the center in the thickness direction are formed in the second metal layer 152 and in the porous body 150.

Bottomed holes 152x and bottomed holes 152y are arranged alternately in the X direction and bottomed holes 152x and bottomed holes 152y are arranged alternately the Y direction in a plan view. Adjacent ones of bottomed holes 152x and bottomed holes 152y that are arranged alternately in the X direction overlap with each other in a plan view and the adjacent bottomed holes 152x and 152y communicate with each other in the overlap to form a pore 152z. Bottomed holes 152x and bottomed holes 152y that are arranged alternately in the Y direction have prescribed intervals and do not overlap in a plan view. Thus, bottomed holes 152x and bottomed holes 152y that are arranged alternately in the Y direction do not form any pores. However, the concept of the disclosure is not limited to this case; bottomed holes 152x and bottomed holes 152y that are arranged alternately in the Y direction may overlap in a plan view and form pores.

The bottomed holes 152x and 152y may be circular holes of about 100 to 300 μm in diameter, for example; however, they may have any shape such as an ellipse or a polygon. For example, the depth of the bottomed holes 152x and 152y may be approximately half of that of the metal layer 152. The interval $L_1$ between adjacent bottomed holes 152x may be about 100 to 400 μm, for example. The interval $L_2$ between adjacent bottomed holes 152y may be about 100 to 400 μm, for example.

The inner wall surface of each of the bottomed holes 152x and 152y may be tapered so that the hole width increases as the position goes from the bottom side to the opening side. However, the concept of the disclosure is not limited to this case; the inner wall surface of each of the bottomed holes 152x and 152y may be perpendicular to the bottom surface or may be curved so as to assume a semicircle. The shorter width $W_3$ of each pore 152z may be set at about 10 to 50 μm, for example, and the longer width $W_4$ of each pore 152z may be set at about 50 to 150 μm, for example.

As shown in FIG. 4, an opening portion 152s which is part of the connection flow channel 180 is also formed in the metal layer 152. The opening portion 152s is a through-hole that penetrates through the metal layer 152 in the thickness direction (Z direction). For example, this through-hole is a connection of a top-surface-side bottomed hole and a bottom-surface-side bottomed hole that coincide with each other in a plan view.

As shown in FIG. 5, an opening portion 152t which is part of the flow channel 170 is also formed in the metal layer 152. The opening portion 152t is a through-hole that penetrates through the metal layer 152 in the thickness direction (Z direction). For example, this through-hole is also a connection of a top-surface-side bottomed hole and a bottom-surface-side bottomed hole that coincide with each other in a plan view.

As shown in FIGS. 4 and 6B, plural bottomed holes 153x which are recessed from the top surface to approximately the center in the thickness direction and plural bottomed holes 153y which are recessed from the bottom surface to approximately the center in the thickness direction are formed in the third metal layer 153 and in the porous body 150.

In the third metal layer 153, rows in which only bottomed holes 153x are arranged in the X direction and rows in which only bottomed holes 153y are arranged in the X direction are arranged alternately in the Y direction. Adjacent ones of the bottomed holes 153x and the bottomed holes 153y in adjacent rows among the rows that are arranged alternately in the Y direction overlap with each other in a plan view and communicate with each other in the overlap to form a pore 153z.

However, the center positions of bottomed holes 153x and 153y that form each pore 153z are deviated from each other in the X direction. In other words, bottomed holes 153x and bottomed holes 153y that form pores 153z are arranged alternately in a direction that is inclined from the X direction and the Y direction. For example, the shapes etc. of the bottomed holes 153x and 153y and the pores 153z may be the same as those of the bottomed holes 152x and 152y and the pores 152z.

The bottomed holes 152y of the second metal layer 152 and the bottomed holes 153x of the third metal layer 153 are formed in such a manner that the former coincide with the latter respectively in a plan view. Thus, no pores are formed in the interface between the second metal layer 152 and the third metal layer 153. However, the concept of the disclosure is not limited to this case; the arrangements of the bottomed holes 153x and the bottomed holes 153y in the X direction and the Y direction may be changed as appropriate so that pores are formed in the interface between the second metal layer 152 and the third metal layer 153.

As shown in FIG. 4, an opening portion 153s which is part of the connection flow channel 180 is also formed in the metal layer 153. The opening portion 153s is a through-hole that penetrates through the metal layer 153 in the thickness direction (Z direction). For example, this through-hole is a connection of a top-surface-side bottomed hole and a bottom-surface-side bottomed hole that coincide with each other in a plan view.

As shown in FIG. 5, an opening portion 153t which is part of the flow channel 170 is also formed in the metal layer 153. The opening portion 153t is a through-hole that penetrates through the metal layer 153 in the thickness direction (Z direction). For example, this through-hole is also a connection of a top-surface-side bottomed hole and a bottom-surface-side bottomed hole that coincide with each other in a plan view.

As shown in FIGS. 4 and 6C, plural bottomed holes 154x which are recessed from the top surface to approximately the center in the thickness direction and plural bottomed holes 154y which are recessed from the bottom surface to approximately the center in the thickness direction are formed in the fourth metal layer 154 and in the porous body 150.

Bottomed holes 154x and bottomed holes 154y are arranged alternately in the X direction and bottomed holes 154x and bottomed holes 154y are arranged alternately in the Y direction in a plan view. Adjacent ones of bottomed holes 154x and bottomed holes 154y that are arranged alternately in the X direction overlap with each other in a plan view and the adjacent bottomed holes 154x and 154y communicate with each other in the overlap to form a pore 154z. Bottomed holes 154x and bottomed holes 154y that are arranged alternately in the Y direction have prescribed intervals and do not overlap in a plan view. Thus, bottomed holes 154x and bottomed holes 154y that are arranged alternately in the Y direction do not form any pores. However, the concept of the disclosure is not limited to this case; bottomed holes 154x and bottomed holes 154y that are arranged alternately in the Y direction may overlap in a plan view and form pores. For example, the shapes etc. of the bottomed holes 154x and 154y and the pores 154z may be the same as those of the bottomed holes 152x and 152y and the pores 152z.

The bottomed holes 153y of the third metal layer 153 and the bottomed holes 154x of the fourth metal layer 154 are formed in such a manner that the former coincide with the latter respectively in a plan view. Thus, no pores are formed in the interface between the third metal layer 153 and the fourth metal layer 154. However, the invention is not limited to this case; the arrangements of the bottomed holes 154x and the bottomed holes 154y in the X direction and the Y direction may be changed as appropriate so that pores are formed in the interface between the third metal layer 153 and the fourth metal layer 154.

As shown in FIG. 4, an opening portion 154s which is part of the connection flow channel 180 is also formed in the metal layer 154. The opening portion 154s is a through-hole that penetrates through the metal layer 154 in the thickness direction (Z direction). For example, this through-hole is a connection of a top-surface-side bottomed hole and a bottom-surface-side bottomed hole that coincide with each other in a plan view.

As shown in FIG. 5, an opening portion 154t which is part of the flow channel 170 is also formed in the metal layer 154. The opening portion 154t is a through-hole that penetrates through the metal layer 154 in the thickness direction (Z direction). For example, this through-hole is also a connection of a top-surface-side bottomed hole and a bottom-surface-side bottomed hole that coincide with each other in a plan view.

As shown in FIGS. 4 and 6D, plural bottomed holes 155x which are recessed from the top surface to approximately the center in the thickness direction and plural bottomed holes 155y which are recessed from the bottom surface to approximately the center n the thickness direction are formed in the fifth metal layer 155 and in the porous body 150.

In the fifth metal layer 155, rows in which only bottomed holes 155x are arranged in the X direction and rows in which only bottomed holes 155y are arranged in the X direction are arranged alternately in the Y direction. Adjacent ones of the bottomed holes 155x and the bottomed holes 155y in adjacent rows among the rows that are arranged alternately in the Y direction overlap with each other in a plan view and communicate with each other in the overlap to form a pore 155z.

However, the center positions of bottomed holes 155x and 155y that form each pore 153z are deviated from each other in the X direction. In other words, bottomed holes 155x and bottomed holes 155y that form pores 155z are arranged alternately in a direction that is inclined from the X direction and the Y direction. For example, the shapes of the bottomed holes 155x and 155y and the pores 155z may be the same as those of the bottomed holes 152x and 152y and the pores 152z.

The bottomed holes 154y of the fourth metal layer 154 and the bottomed holes 155x of the fifth metal layer 155 are formed in such a manner that the former coincide with the latter respectively in a plan view. Thus, no pores are formed in the interface between the fourth metal layer 154 and the fifth metal layer 155. However, the concept of the disclosure is not limited to this case; the arrangements of the bottomed holes 155x and the bottomed holes 155y in the X direction and the Y direction may be changed as appropriate so that pores are formed in the interface between the fourth metal layer 154 and the fifth metal layer 155.

As shown in FIG. 4, an opening portion 155s which is part of the connection flow channel 180 is also formed in the metal layer 155. The opening portion 155s is a through-hole that penetrates through the metal layer 155 in the thickness direction (Z direction). For example, this through-hole is a connection of a top-surface-side bottomed hole and a bottom-surface-side bottomed hole that coincide with each other in a plan view.

As shown in FIG. 5, an opening portion 155t which is part of the flow channel 170 is also formed in the metal layer 155. The opening portion 155t is a through-hole that penetrates through the metal layer 155 in the thickness direction (Z direction). For example, this through-hole is also a connection of a top-surface-side bottomed hole and a bottom-surface-side bottomed hole that coincide with each other in a plan view.

The pores formed in each metal layer communicate with each other and together extend through the porous body 150 three-dimensionally. As a result, because of capillary forces, working fluid C spreads three-dimensionally through the pores that communicate with each other.

As shown in FIG. 4, the opening portions 152s-155s are formed at such positions as to coincide with each other in a plan view and thereby form the connection flow channel 180. No holes or grooves are formed in the metal layers 152-155 in the region between the connection flow channel 180 and the porous body 150, and the solid support member 160 is formed in such a manner that those portions without holes or grooves are laid one on another.

As shown in FIG. 5, the opening portions 152t-155t are formed so as not to coincide with each other in the X direction in a plan view. More specifically, the opening portions 153t and 155t are longer in the X direction than the opening portions 152t and 154t and the side surfaces of the opening portions 153t and 155t are recessed from those of the opening portions 152t and 154t on both of the side of the pipe wall 142 and the side of the pipe wall 143. Since in this manner the positions, in the X direction, of the side surfaces of the opening portions 153t and 155t deviate from those of the side surfaces of the opening portions 152t and 154t, grooves 193 are formed in the metal layer 153 and grooves 195 are formed in the metal layer 155. For example, the grooves 193 and 195 are formed so as to extend in the extension direction of the liquid pipe 140 (in the Y direction, approximately parallel with the flow channel 170).

As described above, the wall surfaces of the liquid pipe 140 (the wall surfaces of the pipe walls 142 and 143) are formed with the grooves 193 and 195, whereby liquid-phase working fluid C in the flow channel 170 of the liquid pipe 140 is guided toward the evaporator 110 by capillary forces generated in the grooves 193 and 195.

The porous body 150 is provided in the vicinity of the injection inlet 141, that is, between the flow channel 170 and the evaporator 110. Thus, liquid-phase working fluid C injected into the liquid pipe 140 through the injection inlet 141 is absorbed by and reserved in the porous body 150. After a start of operation of the loop heat pipe 100, liquid-phase working fluid C that has been guided toward the evaporator 110 by the grooves 193 and 195 is absorbed by and reserved in the porous body 150 before reaching the evaporator 110.

When the evaporator 110 is given a large heat quantity, there may occur a case that the rate at which the evaporator 110 generates vapor Cv exceeds the rate at which the condenser 120 generates liquid-phase working fluid C by condensing vapor Cv. In this case, the amount of liquid-phase working fluid C in the flow channel 170 decreases. In the first embodiment, since liquid-phase working fluid C is reserved in the porous body 150 which is located closer to the evaporator 110 than the flow channel 170 is, the porous body 150 can continue to supply liquid-phase working fluid C to the evaporator 110 even if the amount of liquid-phase working fluid C existing in the flow channel 170 has decreased. As such, the first embodiment can suppress drying-out due to shortage of working fluid C in the liquid pipe 140.

Where the condenser 120 is located under the evaporator 110 in the vertical direction while, for example, the loop heat pipe 100 is in use, gravity acts on the working fluid C in such direction as to move it toward the condenser 120. In the first embodiment, since liquid-phase working fluid C is reserved in the porous body 150, the porous body 150 can continue to supply liquid-phase working fluid C to the evaporator 110 to suppress drying-out.

Even if vapor Cv is forced to flow reversely through the liquid pipe 140 due to, for example, heat leakage from the evaporator 110, capillary forces acting on liquid-phase working fluid C in the porous body 150 can push back the vapor Cv. A reverse flow of the vapor Cv can thus be prevented. The effect of preventing a reverse flow of the vapor Cv is particularly strong in the case where part of the porous body 150 fills the inside of the liquid pipe 140 in the vicinity of the evaporator 110.

Furthermore, part of the porous body 150 is also provided in the evaporator 110. In the evaporator 110, liquid-phase working fluid C permeates into a portion, located on the side of the liquid pipe 140, of the porous body 150 which is provided in the evaporator 110. Resulting capillary forces acting on that portion of working fluid C from the porous body 150 serve as pumping force for circulating the working fluid C through the loop heat pipe 100.

Since these capillary forces counter the vapor Cv existing in the evaporator 110, a reverse flow of the vapor Cv into the liquid pipe 140 can be suppressed.

Although the liquid pipe 140 is formed with the injection inlet 141 for injecting working fluid C, the inside of the loop heat pipe 100 is kept airtight because the injection inlet 141 is closed.

[Manufacturing Method of Loop Heat Pipe]

Next, a manufacturing method of a loop heat pipe according to the first embodiment, mainly a manufacturing method of a porous body, will be described below. FIGS. 7A-7D to FIGS. 10A and 10B are sectional views showing an example manufacturing method of a loop heat pipe according to the first embodiment (FIG. 8B is the same as FIG. 4 and FIG. 10B is the same as FIG. 5).

Figure 7A:
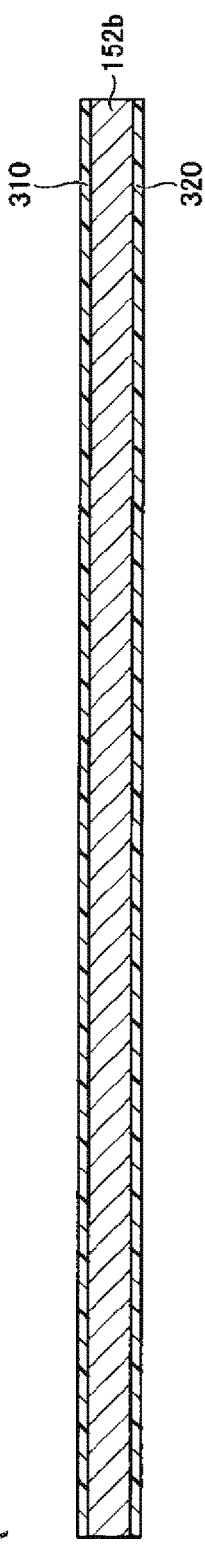
FIGS. 7A-7D are a first set of sectional views showing an example manufacturing method of a loop heat pipe according to the first embodiment.
Figure 9A:
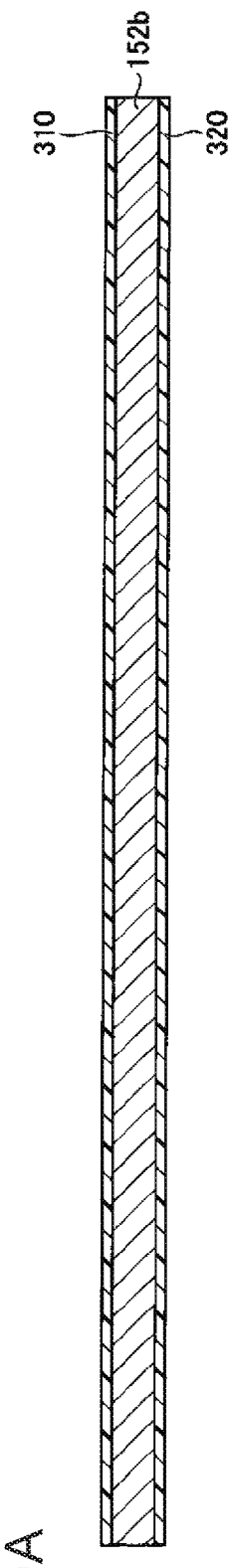
FIGS. 9A-9D are a third set of sectional views showing the example manufacturing method of a loop heat pipe according to the first embodiment.

First, in a step shown in FIGS. 7A and 9A, a metal sheet 152$b$ having the plan-view shape shown in FIG. 1 is prepared. Then resist layers 310 and 320 are formed on the top surface and the bottom surface of the metal sheet 152$b$, respectively. The metal sheet 152$b$, which is to become a metal layer 152 finally, may be made of copper, stainless steel, aluminum, a magnesium alloy, or the like. The thickness of the metal sheet 152$b$ may be about 50 to 200 μm, for example. The resist layers 310 and 320 may be made of a photosensitive dry film resist, for example.

Figure 7B:
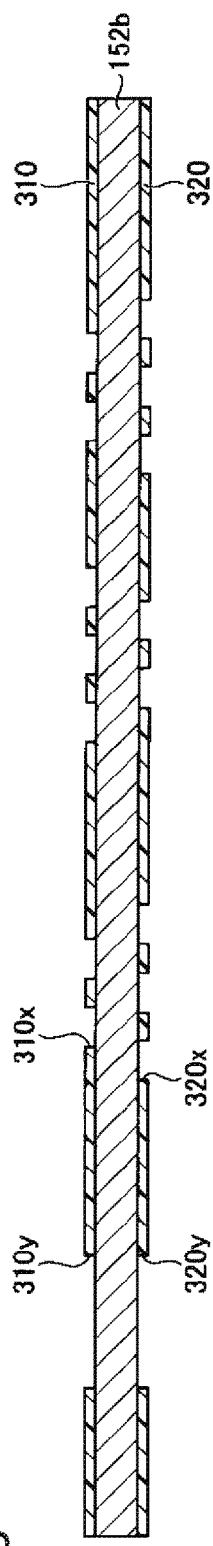
Figure 9B:
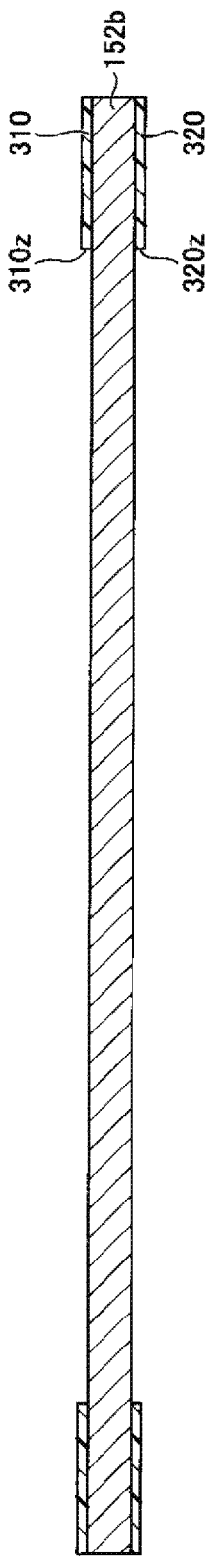

Then, in a step shown in FIGS. 7B and 9B, openings 310$x$ for exposing selected portions of the top surface of the metal sheet 152$b$ are formed by subjecting the resist layer 310 to exposure to light and development in a region, where to form a porous body 150, of the metal sheet 152$b$. Furthermore, openings 320$x$ for exposing selected portions of the bottom surface of the metal sheet 152$b$ are formed by subjecting the resist layer 320 to exposure to light and development in the same region of the metal sheet 152$b$. The shapes and the arrangement of the openings 310$x$ and openings 320$x$ are made the same as those of the bottomed holes 152$x$ and 152$y$ shown in FIG. 6A.

When the resist layer 310 is subjected to exposure to light and development, as shown in FIG. 7B, an opening 310$y$ for exposing a selected portion of the top surface of the metal sheet 152$b$ is formed in a region where to form a connection flow channel 180. And, as shown in FIG. 9B, an opening 310$z$ for exposing a selected portion of the top surface of the metal sheet 152$b$ is formed in a region where to form a flow channel 170. Furthermore, as shown in FIG. 7B, an opening 320$y$ for exposing a selected portion of the bottom surface of the metal sheet 152$b$ is formed in the region where to form the connection flow channel 180. And, as shown in FIG. 9B, an opening 320$z$ for exposing a selected portion of the bottom surface of the metal sheet 152$b$ is formed in the region where to form the flow channel 170.

Figure 7C:
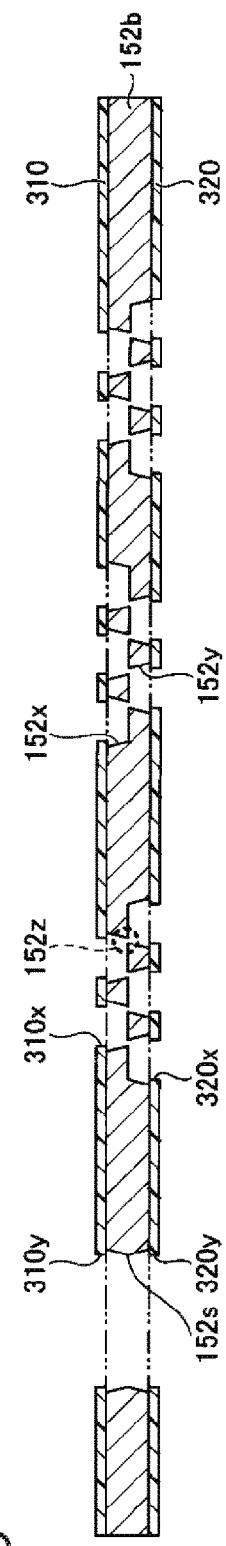
Figure 9C:
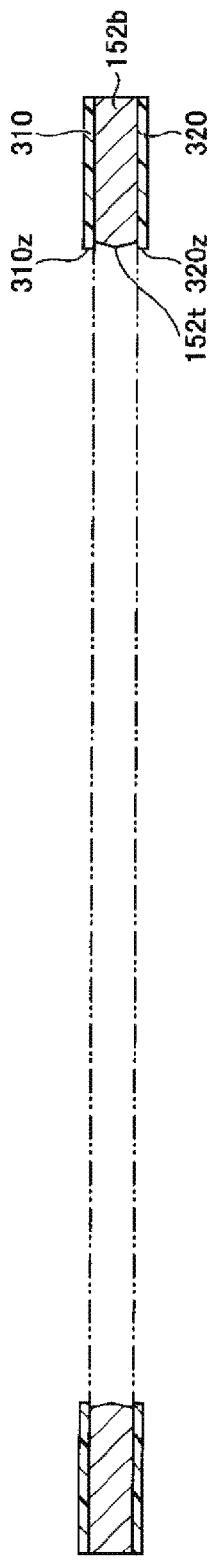

Then, in a step shown in FIGS. 7C and 9C, portions, exposed through the openings 310$x$, 310$y$, and 310$z$, of the metal sheet 152$b$ are half-etched from the top surface side of the metal sheet 152$b$ and portions, exposed through the openings 320$x$, 320$y$, and 320$z$, of the metal sheet 152$b$ are half-etched from the bottom surface side of the metal sheet 152$b$. As a result, bottomed holes 152$x$ are formed in the metal sheet 152$b$ on the top-surface side, bottomed holes 152$y$ are formed in the metal sheet 152$b$ on the bottom-surface side, and opening portions 152$s$ and 152$t$ are formed so as to penetrate through the metal sheet 152$b$. Since adjacent ones of the openings 310$x$ (front side) and the openings 310$y$ (back side) which are arranged alternately in the X direction overlap with each other in a plan view, they communicate with each other in the overlap and form a pore 152$z$. The metal sheet 152$b$ may be half-etched using a ferric chloride solution, for example.

Figure 7D:
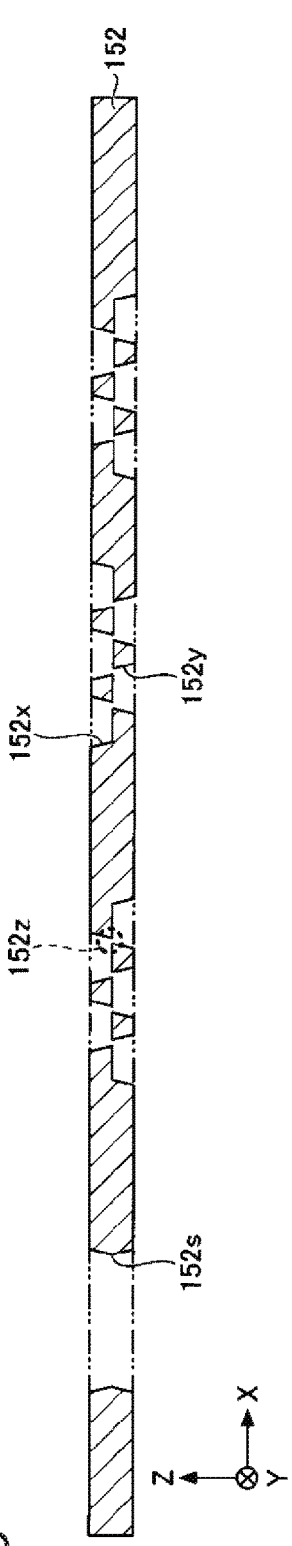
Figure 9D:
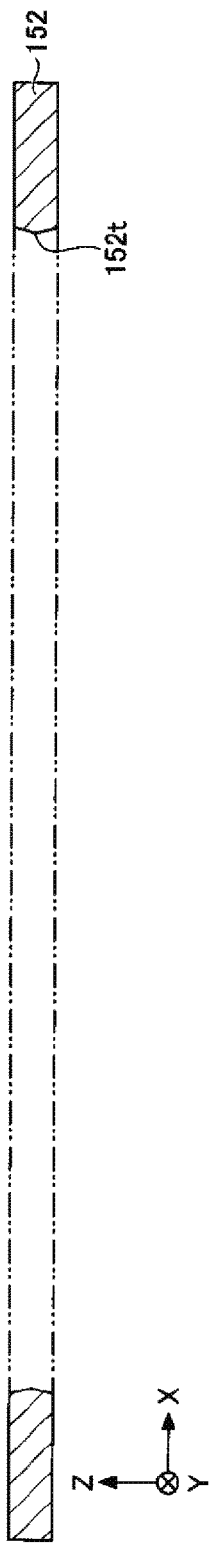

Then, in a step shower in FIGS. 7D and 9D, the resist layers 310 and 320 are peeled off using a peeling liquid. A metal layer 152 is thus completed.

Subsequently, in a step shown in FIGS. 8A and 10A, solid metal layers 151 and 156 which are formed with no holes or grooves are prepared. Metal layers 153, 154, and 155 are formed by the same method as the metal layer 152 was formed. The positions of bottomed holes, pores, and opening portions formed in the metal layers 153, 154, and 155 are made the same as those shown in FIGS. 6B-6D.

Subsequently, in a step shown in FIGS. 8B and 10B, the metal layers 151-156 are laid one on another in the order shown in FIGS. 8A and 10A and subjected to solid-phase joining through pressing and heating. As a result, adjoining metal layers are joined together directly, whereby an evaporator 110, a condenser 120, a vapor pipe 130, and a liquid pipe 140 are formed, a porous body 150 is formed in the evaporator 110 and the liquid pipe 140, and a support member 160 is formed in the liquid pipe 140. A flow channel 170 which is a space for guiding working fluid C to the porous body 150 is formed on the condenser 120 side of the end 150B of the porous body 150, and a connection flow channel 180 is formed between the outside pipe wall 143 of the liquid pipe 140 and the support member 160.

After evacuating the inside of the liquid pipe 140 using a vacuum pump or the like, working fluid C is injected into the liquid pipe 140 through the injection inlet 141. The working fluid C injected into the liquid pipe 140 permeates into the porous body 150 and flows into the flow channel 170 via the connection flow channel 180. At this time, since the solid support member 160 is formed between the porous body 150 and the connection flow channel 180, the working fluid C flows into the flow channel 170 more easily than in a case that the porous body 150 faces the connection flow channel 180. More specifically, where the porous body 150 faces the connection flow channel 180, part of the working fluid C injected through the injection inlet 141 is reserved in the porous body 150 and hence cannot flow from the injection inlet 141 into the flow channel 170 in a short time. On the other hand, in the embodiment, since the support member 160 is provided in the liquid pipe 140, the working fluid C can flow into the flow channel 170 quickly. In this manner, the time for the working fluid C to flow into the flow channel 170 can be shortened very much and hence the manufacturing time of the loop heat pipe 100 can be shortened to a large extent. The injection inlet 141 is closed after the injection of the working fluid C.

The above-mentioned solid-phase joining is a method for joining target objects by heating them to soften them while keeping them in a solid phase (i.e., without melting them) and, furthermore, pressing them against each other to deform them plastically. To allow adjoining metal layers to be joined together satisfactorily by solid-phase joining, it is preferable that all of the metal layers 151-156 be made of the same material.

The loop heat pipe 100 can be manufactured by the above-described manufacturing method.

Since as described above pores are formed in each metal layer by forming bottomed holes from both sides of the metal layer in such a manner that they communicate with each other partially, higher stability can be attained than in the conventional pore forming method in which metal layers formed with through-holes are laid one on another in such a manner that through-holes overlap with each other. More specifically, pores having a constant size can be formed in the metal layers 152-155 because the pores are not affected by positional deviations that may occur when the metal layers 152-155 are laid one on another or positional deviations that may occur due to expansion and contraction of the metal layers 152-155 when they are subjected to heating when laid one on another.

As a result, reduction of capillary forces of the pores due to a variation of their sizes and hence the effect of suppressing a reverse flow of vapor Cv from the evaporator 110 to the liquid pipe 140 can be obtained stably.

At the interface between two metal layers, each associated pair of bottomed holes in the two metal layers are formed so as to coincide with each other in a plan view, whereby the contact area of the two metal layers can be increased to enable strong joining.

Furthermore, this manufacturing method makes it possible to form the bottomed holes and the pores of the porous body 150 and the through-holes of the flow channel 170 and the connection flow channel 180 at the same time.

(Modification of First Embodiment)

Figure 11:
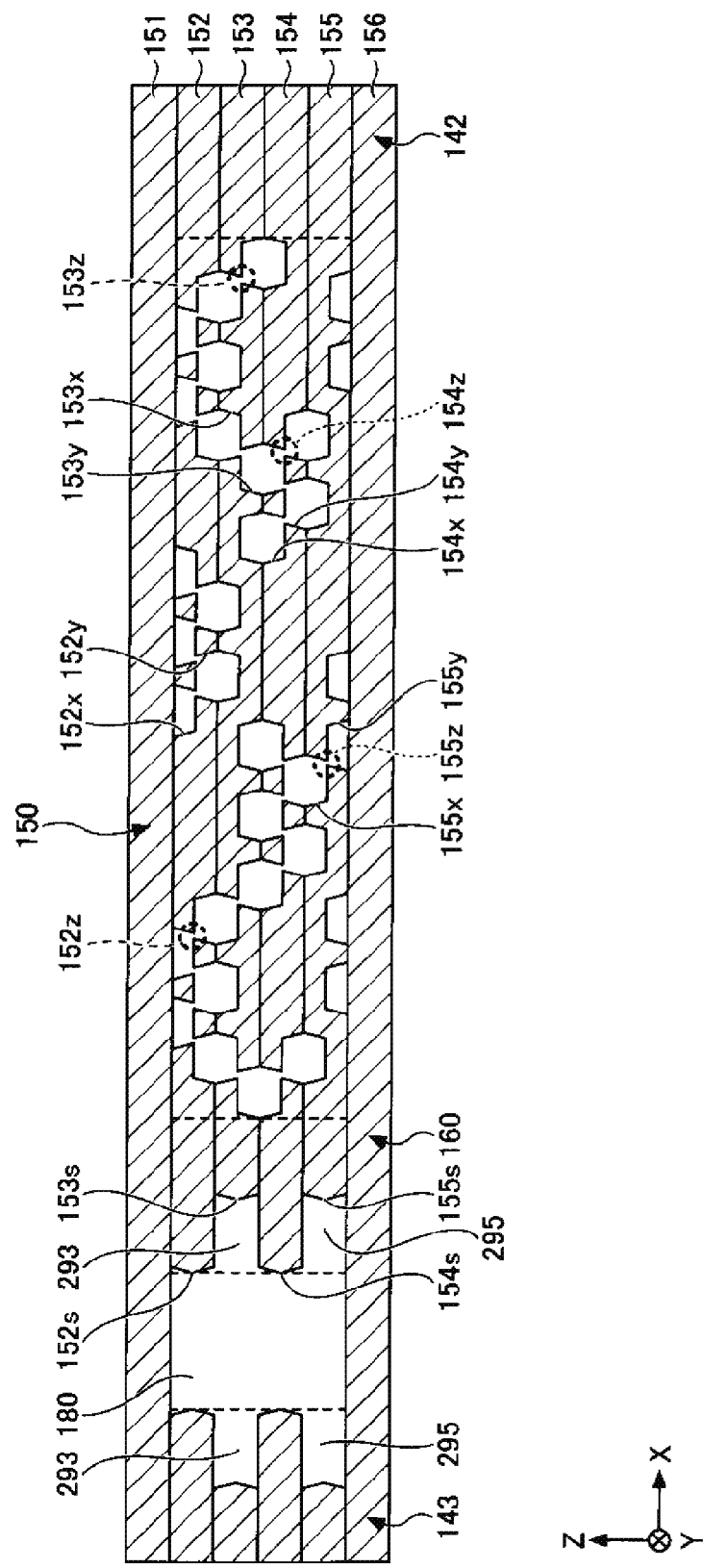
FIG. 11 is a sectional view showing an example internal structure of a loop heat pipe according to a modification of the first embodiment.

Next, a modification of the first embodiment will be described which is different from the first embodiment in the structure of the connection flow channel 180. FIG. 11 is a sectional view showing an example internal structure of a loop heat pipe according to the modification of the first embodiment. FIG. 11 corresponds to FIG. 4 which is a sectional view taken along line I-I in FIG. 3.

Like the loop heat pipe 100 according to the first embodiment, the loop heat pipe according to the modification of the first embodiment is equipped with a liquid pipe 140, a porous body 150, a support member 160, a flow channel 170, and a connection flow channel 180.

On the other hand, as shown in FIG. 11, the opening portions 152s-155s are formed so as to be deviated alternately in the X direction in a plan view. More specifically, in the X direction, opening portions 153s and 155s are larger than opening portions 152s and 154s and the side surfaces of the opening portions 153s and 155s are recessed from those of the opening portions 152s and 154s on both sides, that is, on the side of the pipe wall 143 and on the side of the support member 160. Thus, the position, in the X direction, of the side surfaces of the opening portions 153s and 155s is deviated from that of the side surfaces of the opening portions 152s and 154s, whereby grooves 293 are formed in a metal layer 153 and grooves 295 are formed in a metal layer 155. For example, the grooves 293 and 295 are formed so as to extend in the extension direction of the liquid pipe 140 (in the Y direction, approximately parallel with the connection flow channel 180).

The modification of the first embodiment is the same as the first embodiment in the other part of the configuration.

This modification can provide the same advantages as the first embodiment. In addition, the grooves 293 and 295 which are formed in the wall surfaces of the connection flow channel 180 accelerate flow of liquid-phase working fluid C, whereby working fluid C injected through the injection inlet 141 can be guided to the flow channel 170 more quickly.

For example, the grooves 293 can be formed at the same time as the bottomed holes 153x and 153y in the following manner. That is, openings that conform in plan-view shape to the grooves 293 to be formed are formed through resist layers formed on the top surface and the bottom surface of a metal sheet to become the metal layer 153 finally and then the metal sheet is half-etched. Like the grooves 293, for example, grooves 295 can be formed at the same time as the bottomed holes 155x and 155y.

Embodiment 2

Figure 12:
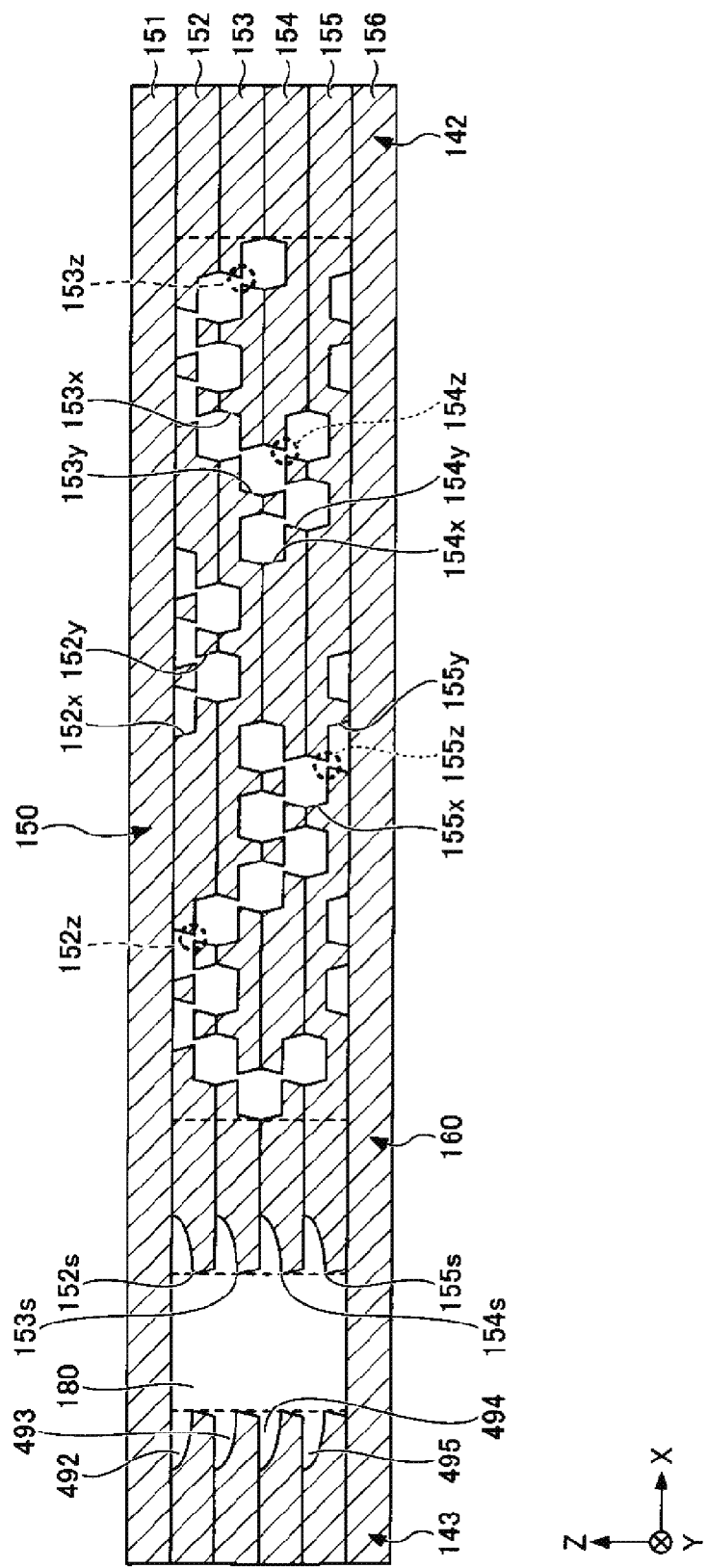
FIG. 12 is a first sectional view showing an example internal structure of a loop heat pipe according to a second embodiment.
Figure 13:
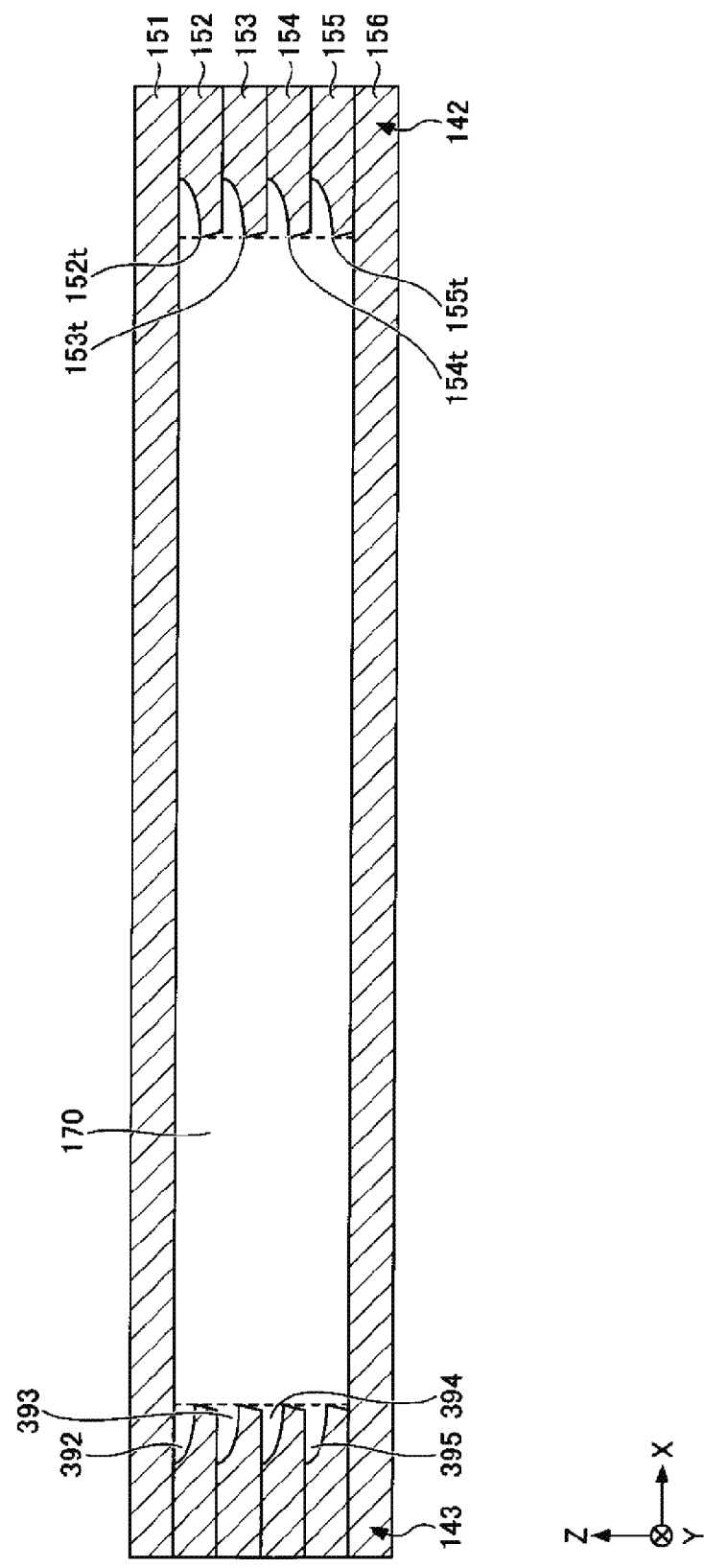
FIG. 13 is a second sectional view showing an example internal structure of the loop heat pipe according to the second embodiment.

Next, a second embodiment will be described which is different from the first embodiment in the structures of the flow channel 170 and the connection flow channel 180. FIGS. 12 and 13 are sectional views showing an internal structure of a loop heat pipe according to the second embodiment. FIGS. 12 and 13 are sectional views corresponding to FIGS. 4 and 5 which are the sectional views taken along lines I-I and II-II in FIG. 3, respectively.

Like the loop heat pipe 100 according to the first embodiment, the loop heat pipe according to the second embodiment is equipped with a liquid pipe 140, a porous body 150, a support member 160, a flow channel 170, and a connection flow channel 180.

On the other hand, as shown in FIG. 12, on the side of each of the support member 160 and a pipe wall 143, a groove 492 that is recessed from the top surface to approximately the center in the thickness direction is formed at a periphery of an opening portion 152s in the same manner as a bottomed hole 152x. That is, the top surface of a metal layer 152 is formed with the groove 492 that is continuous with the connection flow channel 180. The depth of the groove 492 may be, for example, approximately half of the thickness of the metal layer 152.

As shown in FIG. 12, on the side of each of the support member 160 and the pipe wall 143, a groove 493 that is recessed from the top surface to approximately the center in the thickness direction is formed at a periphery of an opening portion 153s in the same manner as a bottomed hole 153x. That is, the top surface of a metal layer 153 is formed with the groove 493 that is continuous with the connection flow channel 180. The depth of the groove 493 may be, for example, approximately half of the thickness of the metal layer 153.

As shown in FIG. 12 on the side of each of the support member 160 and the pipe wall 143, a groove 494 that is recessed from the top surface to approximately the center in the thickness direction is formed at a periphery of an opening portion 154s in the same manner as a bottomed hole 154x. That is, the top surface of a metal layer 154 is formed with the groove 494 that is continuous with the connection flow channel 180. The depth of the groove 494 may be, for example, approximately half of the thickness of the metal layer 154.

As shown in FIG. 12, on the side of each of the support member 160 and the pipe wall 143, a groove 495 that is recessed from the top surface to approximately the center in the thickness direction is formed at a periphery of an opening portion 155s in the same manner as a bottomed hole 155x. That is, the top surface of a metal layer 155 is formed with the groove 495 that is continuous with the connection flow channel 180. The depth of the groove 495 may be, for example, approximately half of the thickness of the metal layer 155.

Each of the grooves 492-495 has a curved (i.e., concave) inner wall surface. Although in FIG. 12 the bottomed holes of the porous body 150 is tapered in cross section, each of them may also have a curved (i.e., concave) inner wall surface.

Opening portions 152s-155s are formed at the same position in a plan view. For example, the grooves 492-495 are formed so as to extend in the extension direction of the liquid pipe 140 (in the Y direction, approximately parallel with the connection flow channel 180).

As shown in FIG. 13, the second embodiment is further different from the first embodiment in the shape of the grooves that are formed in the wall surfaces of the liquid pipe 140 between the end 150B of the porous body 150 and the condenser 120.

More specifically, as shown in FIG. 13, on the side of each of the pipe walls 142 and 143, a groove 392 that is recessed from the top surface to approximately the center in the thickness direction is formed at a periphery of an opening portion 152t in the same manner as a bottomed hole 152x. That is, the top surface of the metal layer 152 is formed with the groove 392 that is continuous with the flow channel 170. The depth of the groove 392 may be, for example, approximately half of the thickness of the metal layer 152.

As shown in FIG. 13, on the side of each of the pipe walls 142 and 143, a groove 393 that is recessed from the top surface to approximately the center in the thickness direction is formed at a periphery of an opening portion 153t in the same manner as a bottomed hole 153x. That is, the top surface of the metal layer 153 is formed with the groove 393 that is continuous with the flow channel 170. The depth of the groove 393 may be, for example, approximately half of the thickness of the metal layer 153.

As shown in FIG. 13, on the side of each of the pipe walls 142 and 143, a groove 394 that is recessed from the top surface to approximately the center in the thickness direction is formed at a periphery of an opening portion 154t in the same manner as a bottomed hole 154x. That is, the top surface of the metal layer 154 is formed with the groove 394 that is continuous with the flow channel 170. The depth of the groove 394 may be, for example, approximately half of the thickness of the metal layer 154.

As shown in FIG. 13, on the side of each of the pipe walls 142 and 143, a groove 395 that is recessed from the top surface to approximately the center in the thickness direction is formed at a periphery of an opening portion 155t in the same manner as a bottomed hole 155x. That is, the top surface of the metal layer 155 is formed with the groove 395 that is continuous with the flow channel 170. The depth of the groove 395 may be, for example, approximately half of the thickness of the metal layer 155.

Each of the grooves 392-395 has a curved (i.e., concave) inner wall surface. However, the concept of the disclosure is not limited to this case; each of the grooves 392-395 may be tapered in cross section like the bottomed holes of the porous body 150 shown in FIG. 12.

The opening portions 152t-155t are formed at the same position in a plan view. For example, the grooves 392-395 are formed so as to extend in the extension direction of the liquid pipe 140 (in the Y direction, approximately parallel with the flow channel 170).

The second embodiment is the same as the first embodiment in the other part of the configuration.

The second embodiment can provide the same advantages as the first embodiment. In addition, the grooves 392-395 which are formed in the wall surfaces of the flow channel 170 accelerate flow of liquid-phase working fluid C. Since the number of grooves is larger than that in the first embodiment, the heat transport performance can be enhanced even further.

Furthermore, the grooves 492-495 which are formed in the wall surfaces of the connection flow channel 180 accelerate flow of liquid-phase working fluid C. Since the number of grooves is larger than that in the first embodiment, working fluid C injected through the injection inlet 141 can be guided to the flow channel 170 more quickly.

For example, the grooves 352 and 492 can be formed at the same time as the bottomed holes 152x in the following manner. That is, an opening 310z (see FIG. 9B) and an opening 310y (see FIG. 7B) are formed through a resist layer 310 formed on a metal sheet 152b so as to conform in plan-view shape to the grooves 392 and 492 to be formed finally and then the metal sheet 152b is half-etched. Like the grooves 392 and 492, for example, grooves 393-395 and 493-495 can be formed at the same time as the bottomed holes 153x-155x, respectively.

As in the first embodiment, the wall surfaces of the connection flow channel 180 need not always be formed with the grooves 492-495. As in the modification of the first embodiment, the wall surfaces of the connection flow channel 180 may be formed with the grooves 293 and 295 in place of the grooves 492-495.

Embodiment 3

Figure 14:
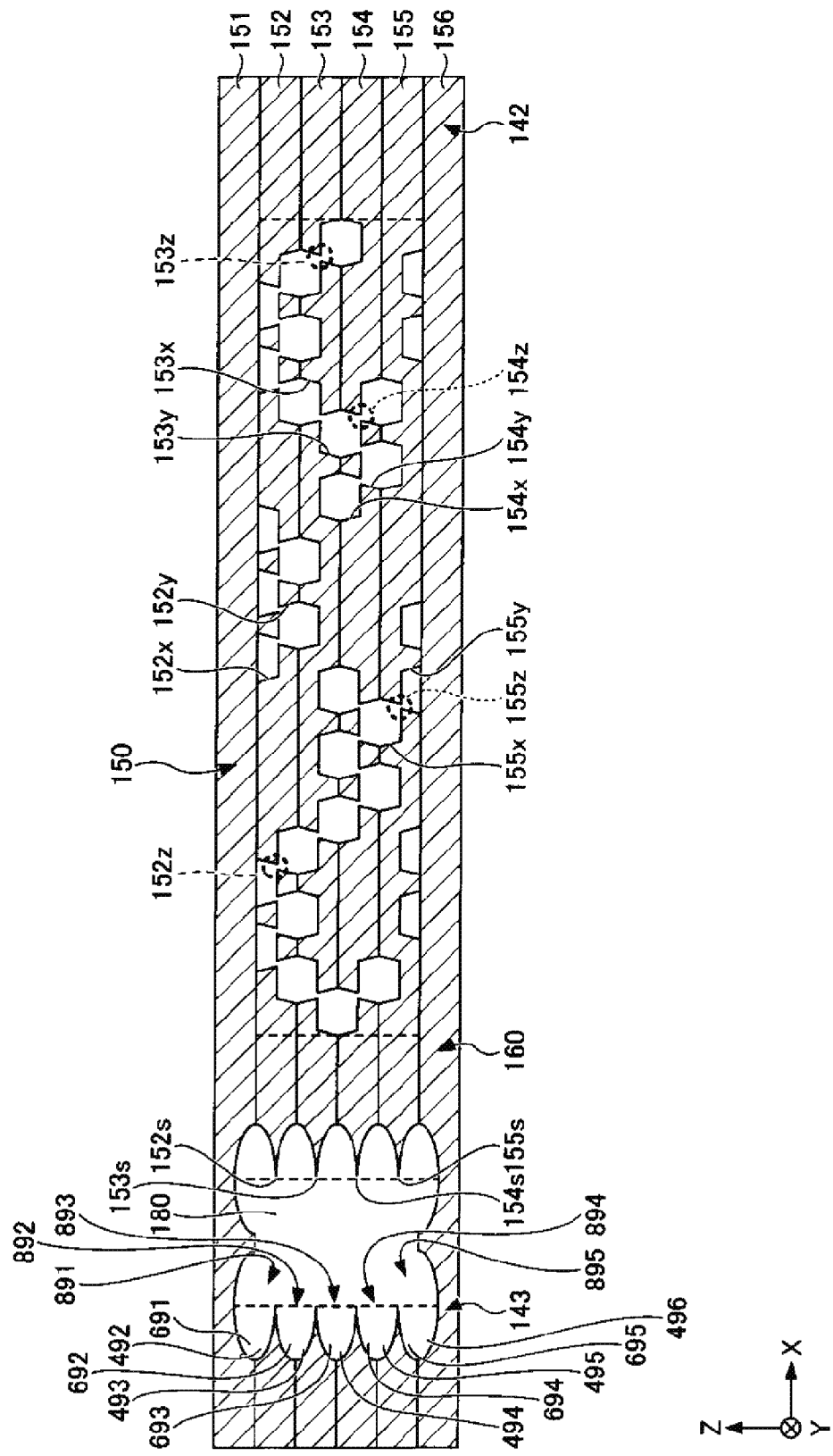
FIG. 14 is a first sectional view showing an example internal structure of a loop heat pipe according to a third embodiment.

Next, a third embodiment will be described which is different from the first embodiment in the structures of the flow channel 170 and the connection flow channel 180. FIGS. 14 and 15 are sectional views showing the internal structure of a loop heat pipe according to the third embodiment. FIGS. 14 and 15 are sectional views corresponding to FIGS. 4 and 5 which are the sectional views taken along lines I-I and II-II in FIG. 3, respectively.

Like the loop heat pipe according to the second embodiment, the loop heat pipe according to the third embodiment is equipped with a liquid pipe 140, a porous body 150, a support member 160, a flow channel 170, and a connection flow channel 180.

On the other hand, as shown in FIG. 14, on the side of each of the support member 160 and a pipe wall 143, not only the groove 492 but also a groove 692 that is recessed from the bottom surface to approximately the center in the thickness direction is formed at a periphery of an opening portion 152s, in the same manner as a bottomed hole 152y. That is, the bottom surface of a metal layer 152 is formed with the groove 692 that is continuous with the connection flow channel 180. The depth of the groove 692 may be, for example, approximately half of the thickness of the metal layer 152.

As shown in FIG. 14, on the side of each of the support member 160 and the pipe wall 143, not only the groove 493 but also a groove 693 that is recessed from the bottom surface to approximately the center in the thickness direction is formed at a periphery of an opening portion 153s, in the same manner as a bottomed hole 153y. That is, the bottom surface of a metal layer 153 is formed with the groove 693 that is continuous with the connection flow channel 180. The depth of the groove 693 may be, for example, approximately half of the thickness of the metal layer 153.

As shown in FIG. 14, on the side of each of the support member 160 and the pipe wall 143, not only the groove 494 but also a groove 694 that is recessed from the bottom surface to approximately the center in the thickness direction is formed at a periphery of an opening portion 154s, in the same manner as a bottomed hole 154y. That is, the bottom surface of a metal layer 154 is formed with the groove 494 that is continuous with the connection flow channel 180. The depth of the groove 494 may be, for example, approximately half of the thickness of the metal layer 154.

As shown in FIG. 14, on the side of each of the support member 160 and the pipe wall 143, not only the groove 495 but also a groove 695 that is recessed from the bottom surface to approximately the center in the thickness direction is formed at a periphery of an opening portion 155s, in the same manner as a bottomed hole 155y. That is, the bottom surface of a metal layer 155 is formed with the groove 695 that is continuous with the connection flow channel 180. The depth of the groove 695 may be, for example, approximately half of the thickness of the metal layer 155.

The grooves 692 are connected to the grooves 493 to form grooves 892, respectively. The grooves 693 are connected to the grooves 494 to form grooves 893, respectively. The grooves 694 are connected to the grooves 495 to form grooves 894, respectively.

Furthermore, as shown in FIG. 14, on the side of each of the support member 160 and the pipe wall 143, a groove 691 that is recessed from the bottom surface to approximately the center in the thickness direction is formed in a metal layer 151 so as to be continuous with the groove 492. That is, the bottom surface of the metal layer 151 is formed with the groove 691 that is continuous with the connection flow channel 180. The depth of the groove 691 may be, for example, approximately half of the thickness of the metal layer 151. The grooves 691 and 492 are connected to each other to form a groove 891.

As shown in FIG. 14, on the side of each of the support member 160 and the pipe wall 143, a groove 496 that is recessed from the top surface to approximately the center in the thickness direction is formed in a metal layer 156 so as to be continuous with the groove 695. That is, the top surface of the metal layer 156 is formed with the groove 496 that is continuous with the connection flow channel 180. The depth of the groove 496 may be, for example, approximately half of the thickness of the metal layer 156. The grooves 695 and 496 are connected to each other to form a groove 895.

Each of the grooves 691-695 and 496 has a curved (i.e., concave) inner wall surface. Although in FIG. 14 the bottomed holes of the porous body 150 is tapered in cross section, each of them may also have a curved (i.e., concave) inner wall surface.

As in the second embodiment, opening portions 152s-155s are formed at the same position in a plan view. For example, the grooves 891-895 are formed so as to extend in the extension direction of the liquid pipe 140 (in the Y direction, approximately parallel with the connection flow channel 180).

As shown in FIG. 15, the third embodiment is further different from the second embodiment in the shape of the grooves that are formed in the wall surfaces of the liquid pipe 140 between the end 150B of the porous body 150 and the condenser 120.

More specifically, as shown in FIG. 15, the side of each of the pipe walls 142 and 143, not only the groove 392 but also a groove 592 that is recessed from the bottom surface to approximately the center in the thickness direction is formed at a periphery of an opening portion 152t in the same manner as a bottomed hole 152y. That is, the bottom surface of the metal layer 152 is formed with the grooves 592 that are continuous with the flow channel 170. The depth of the grooves 592 may be, for example, approximately half of the thickness of the metal layer 152.

As shown in FIG. 15, on the side of each of the pipe walls 142 and 143, not only the groove 393 but also a groove 593 that is recessed from the bottom surface to approximately the center in the thickness direction is formed at a periphery of an opening portion 153t in the same manner as a bottomed hole 153y. That is, the bottom surface of the metal layer 153 is formed with the grooves 593 that are continuous with the flow channel 170. The depth of the grooves 593 may be, for example, approximately half of the thickness of the metal layer 153.

As shown in FIG. 15, on the side of each of the pipe walls 142 and 143, not only the groove 394 but also a groove 594 that is recessed from the bottom surface to approximately the center in the thickness direction is formed at a periphery of an opening portion 154t in the same manner as a bottomed hole 154y. That is, the bottom surface of the metal layer 154 is formed with the grooves 594 that are continuous with the flow channel 170. The depth of the grooves 594 may be, for example, approximately half of the thickness of the metal layer 154.

As shown in FIG. 15, on the side of each of the pipe walls 142 and 143, not only the groove 395 but also a groove 595 that is recessed from the bottom surface to approximately the center in the thickness direction is formed at a periphery of an opening portion 155t in the same manner as a bottomed hole 155y. That is, the bottom surface of the metal layer 155 is formed with the grooves 595 that are continuous with the flow channel 170. The depth of the grooves 595 may be, for example, approximately half of the thickness of the metal layer 155.

The grooves 592 are connected to the grooves 393 to form grooves 792, respectively. The grooves 593 are connected to the grooves 394 to form grooves 793, respectively. The grooves 594 are connected to the grooves 395 to form grooves 794, respectively.

Furthermore, as shown in FIG. 15, on the side of each of the pipe walls 142 and 143, a groove 591 that is recessed from the bottom surface to approximately the center in the thickness direction is formed in the metal layer 151 so as to be continuous with the groove 392. That is, the bottom surface of the metal layer 151 is formed with the groove 591 that is continuous with the flow channel 170. The depth of the groove 591 may be, for example, approximately half of the thickness of the metal layer 151. The grooves 591 and 392 are connected to each other to form a groove 791.

As shown in FIG. 15, on the side of each of the pipe walls 142 and 143, a groove 396 that is recessed from the top surface to approximately the center in the thickness direction is formed in the metal layer 156 so as to be continuous with the groove 595. That is, the top surface of the metal layer 156 is formed with the groove 396 that is continuous with the flow channel 170. The depth of the groove 396 may be, for example, approximately half of the thickness of the metal layer 156. The grooves 595 and 396 are connected to each other to form a groove 795.

Each of the grooves 591-595 and 396 has a curved (i.e., concave) inner wall surface. However, the concept of the disclosure is not limited to this case; each of the grooves 591-595 and 396 may be tapered in cross section like the bottomed holes of the porous body 150 shown in FIG. 14.

As in the second embodiment, the opening portions 152*t*-155*t* are formed at the same position in a plan view. For example, the grooves 791-795 are formed so as to extend in the extension direction of the liquid pipe 140 (in the Y direction, approximately parallel with the flow channel 170).

The third embodiment is the same as the second embodiment in the other aspects of the configuration.

The third embodiment can provide the same advantages as the second embodiment. In addition, the grooves 791-795 which are formed in the wall surfaces of the flow channel 170 accelerate flow of liquid-phase working fluid C. Since the number of grooves is larger than that in the second embodiment, the heat transport performance can be enhanced even further.

Furthermore, the grooves 891-895 which are formed in the wall surfaces of the connection flow channel 180 accelerate flow of liquid-phase working fluid C. Since the number of grooves is larger than that in the second embodiment, working fluid C injected through the injection inlet 141 can be guided to the flow channel 170 more quickly.

For example, the grooves 592 and 692 can be formed at the same time as the bottomed holes 152*y* in the following manner. That is, an opening 320*z* (see FIG. 9B) and an opening 320*y* (see FIG. 7B) are formed through a resist layer 320 formed on a metal sheet 152*b* so as to conform in plan-view shape to the grooves 592 and 692 to be formed finally and then the metal sheet 152*b* is half-etched. Like the grooves 592 and 592, for example, grooves 593-595 and 693-695 can be formed at the same time as the bottomed holes 153*y*-155*y*, respectively.

The grooves 591, 691, 396, and 496 of the metal layers 151 and 156 can be formed by half-etching metal sheets using resist layers having openings in regions where the grooves 591, 691, 396, and 496 of the metal layers 151 and 156 are to be formed.

In each of the above embodiments, in the liquid pipe 140, the porous body 150 may not always be in contact with the inside pipe wall 142 and may be separated from the inside pipe wall 142. The porous body 150 may not always fill the inside space of the liquid pipe 140 between the injection inlet 141 and the evaporator 110. For example, the porous body 150 may be separated from the outside pipe wall 143 instead of being in contact with it.

A solid support member that is connected to the end 150B of the porous body 150 and extends in the extension direction of the liquid pipe 140 (in the Y direction, approximately parallel with the flow channel 170) may be provided in the flow channel 170. Providing such a solid support member can increase the mechanical strength in the thickness direction (Z direction). The side surfaces of the support member may be formed with grooves. Such grooves accelerate flow of liquid-phase working fluid C like the grooves 193 and 195 etc. Furthermore, a shield body for absorbing working fluid C that cannot be absorbed by the porous body 150 and interrupting movement of liquid-phase working fluid C from the side of the evaporator 110 to the side of the condenser 120 in the liquid pipe 140 may be provided in the liquid pipe 140. For example, the shield body may be a porous body in which, as in the porous body 150, bottomed holes and pores are formed in the metal layers 162 and 155.

A porous body for guiding working fluid C as liquefied by the condenser 120 toward the evaporator 110 may be disposed closer to the condenser 120 than the end 150B of the porous body 150 and spaced from the porous body 150. For example, such a porous body may be disposed close to the pipe walls 142 and 143.

Bottomed holes may be formed in the metal layers 151 and 156 in the region of the porous body 150. Bottomed holes may be formed in the portions, exposed to the flow channel 170, of the metal layers 151 and 156 such that working fluid C reserved in the porous body 150 does not flow into the flow channel 170. Forming bottomed holes also in the metal layers 151 and 156 makes it possible to increase the heat transport performance even further.

The support member 160 may not be formed between the porous body 150 and the connection flow channel 180; the porous body 150 may face the connection flow channel 180.

Not all of the holes of the porous body 150 may not be bottomed holes; the porous body 150 may include through-holes.

The injection inlet 141 may be disposed at any position between the ends 150A and 150B of the porous body 150; for example, in the liquid pipe 140 shown in FIG. 3 which is L-shaped in a plan view, the injection inlet 141 may be disposed at a position that is closer to the condenser 120 than its bent portion is.

Although the preferred embodiments etc. have been described in detail, the concept of the disclosure is not limited to the above-described embodiments etc. and various modifications and replacements can be made in the above-described embodiments etc. without departing from the scope of the claims.

Various aspects of the subject matter described herein are set out non-exhaustively in the following numbered clauses:

1) A method of manufacturing a loop heat pipe,
the loop heat pipe comprising:
an evaporator configured to evaporate working fluid;
a condenser configured to condense the working fluid;
a liquid pipe which connects the evaporator and the condenser and comprises an injection inlet through which the working fluid is injected;
a vapor pipe which connects the evaporator and the condenser and forms a loop together with the liquid pipe; and
a porous body which is provided in the liquid pipe and configured to reserve liquid-phase working fluid;

the method comprising:
providing each of a plurality of metal layers; and
stacking the metal layers one on another,
the providing each of the metal layers comprising:
preparing a metal sheet;
forming bottomed holes in a top surface of the metal sheet;
forming bottomed holes in a bottom surface of the metal sheet; and
forming an opening portion through the metal sheet, and wherein:
the porous body includes the bottomed holes of each of the metal layers;
a flow channel is formed by the opening portions of the respective metal layers;
a first end of the porous body is located between the injection inlet and the evaporator; and
a second end of the porous body which is opposite to the first end is located between the injection inlet and the condenser.

What is claimed is:

1. A loop heat pipe comprising:
an evaporator configured to evaporate working fluid;
a condenser configured to condense the working fluid;
a liquid pipe which connects the evaporator and the condenser;
a vapor pipe which connects the evaporator and the condenser and forms a loop together with the liquid pipe; and
a porous body which is provided in the liquid pipe and configured to reserve liquid-phase working fluid, wherein
the liquid pipe is formed of a plurality of stacked metal layers which are stacked in a stacking direction,
the liquid pipe has a first pipe wall and a second pipe wall, wherein the second pipe wall is spaced from first pipe wall, and the second pipe wall is opposed to the first pipe wall in a direction perpendicular to the stacking direction,
a solid support member is provided between the first pipe wall and the second pipe wall, the solid support member is spaced from the first pipe wall and the second pipe wall, and the solid support member comprises: a first sidewall spaced from and facing the second pipe wall; and a second sidewall spaced from and facing the first pipe wall,
the porous body is provided between the first pipe wall and the solid support member, the porous body comprising: a third sidewall in contact with the first pipe wall; and a fourth sidewall opposite to the third sidewall, the fourth sidewall in contact with the second sidewall of the solid support member,
the liquid pipe comprises: an injection inlet through which the working fluid is injected, the injection inlet being formed in the second pipe wall; and a connection flow channel provided between the first sidewall of the solid support member and the second pipe wall,
a first end of the porous body is located between the injection inlet and the evaporator,
a second end of the porous body which is opposite to the first end is located between the injection inlet and the condenser, and
at least a portion of the porous body is provided between the injection inlet and the evaporator, and the at least the portion of the porous body fills the inside of the liquid pipe.

2. The loop heat pipe according to claim 1, wherein a wall surface of at least one of the first pipe wall and the second pipe wall of the liquid pipe is formed with at least one groove between the second end and the condenser.

3. The loop heat pipe according to claim 2, wherein the at least one groove extends in an extension direction of the liquid pipe.

4. The loop heat pipe according to claim 1, wherein the liquid pipe comprises:
a flow channel which is a space provided between the second end and the condenser,
wherein the connection flow channel which communicates with the injection inlet and the flow channel.

5. The loop heat pipe according to claim 1, wherein the solid support member extends between the injection inlet and the second end.

6. The loop heat pipe according to claim 1, wherein the solid support member is provided between the porous body and the connection flow channel so as to separate the porous body and the connection flow channel from each other.

7. The loop heat pipe according to claim 1, wherein
the at least the portion of the porous body which is provided between the injection inlet and the evaporator is in contact with the first pipe wall and the second pipe wall.

8. The loop heat pipe according to claim 1, wherein
the porous body is configured by a plurality of metal layers, and
each of the metal layers comprises:
a first surface;
a second surface that is opposite to the first surface;
a first bottomed hole formed in the first surface;
a second bottomed hole formed in the second surface; and
a pore formed by partial communication of the first bottomed hole and the second bottomed hole.

9. The loop heat pipe according to claim 1, wherein
each of the first pipe wall and the second pipe wall is defined by and includes all of the plurality of the stacked metal layers,
the plurality of stacked metal layers include: a first outermost metal layer at a first outermost side of the liquid pipe and defining a third pipe wall; and a second outermost metal layer at a second outermost side of the liquid pipe opposite to the first outmost side of the liquid pipe, the second outermost metal layer defining a fourth pipe wall, and
the third pipe wall is spaced from the fourth pipe wall, the third pipe wall opposes the fourth pipe wall, and the third pipe wall and the fourth pipe wall extend in the direction perpendicular to the stacking direction between the first pipe wall and the second pipe so that the first pipe wall, the second pipe wall, the third pipe wall, and the fourth pipe wall together define a rectangular cross sectional shape when viewed in a cross sectional direction perpendicular to both the stacking direction and the direction perpendicular to the stacking direction.

* * * * *